(12) United States Patent
Wells et al.

(10) Patent No.: US 7,557,002 B2
(45) Date of Patent: Jul. 7, 2009

(54) METHODS OF FORMING TRANSISTOR DEVICES

(75) Inventors: David H. Wells, Boise, ID (US); Eric R. Blomiley, Boise, ID (US)

(73) Assignee: Micron Technology, Inc., Boise, ID (US)

(*) Notice: Subject to any disclaimer, the term of this patent is extended or adjusted under 35 U.S.C. 154(b) by 235 days.

(21) Appl. No.: 11/506,542

(22) Filed: Aug. 18, 2006

(65) Prior Publication Data

US 2008/0044979 A1   Feb. 21, 2008

(51) Int. Cl.
*H01L 21/20* (2006.01)
(52) U.S. Cl. ............... 438/238; 438/243; 438/259; 438/311; 438/381; 438/700; 257/E21.017; 257/E21.229; 257/E21.278; 257/E21.304; 257/E21.562; 257/E29.056; 257/E29.286; 257/E29.295; 257/E29.298
(58) Field of Classification Search ............ 438/50, 438/245, 388, 238, 243, 259, 311, 381, 700, 438/703, 752, 753; 257/E21.017, 229, 278, 257/304, 545, 562, 646, 651, E29.056, 286, 257/295, 298
See application file for complete search history.

(56) References Cited

U.S. PATENT DOCUMENTS

| | | | |
|---|---|---|---|
| 4,820,654 A | 4/1989 | Lee | |
| 4,993,143 A | 2/1991 | Sidner et al. | |
| 5,021,843 A | 6/1991 | Ohmi | |
| 5,281,840 A * | 1/1994 | Sarma | 257/351 |
| 5,374,329 A | 12/1994 | Miyawaki | |
| 5,405,802 A | 4/1995 | Yamagata et al. | |
| 5,453,394 A | 9/1995 | Yonehara et al. | |
| 5,670,411 A | 9/1997 | Yonehara et al. | |
| 5,767,020 A | 6/1998 | Sakaguchi et al. | |
| 5,773,355 A | 6/1998 | Inoue et al. | |
| 5,841,171 A | 11/1998 | Iwamatsu et al. | |
| 5,849,627 A | 12/1998 | Linn et al. | |
| 5,882,532 A | 3/1999 | Field et al. | |
| 5,910,672 A | 6/1999 | Iwamatsu et al. | |

(Continued)

FOREIGN PATENT DOCUMENTS

DE   102005010821 A1   9/2006

(Continued)

OTHER PUBLICATIONS

Yeo, et al., "80 nm 512M DRAM with Enhanced Data Retention Using Partially-Insulated Cell Array Transistor (PiCAT)", 2004 Symposium on VLSI Technology, Digest of Technical Papers, IEEE, pp. 30-31.

(Continued)

*Primary Examiner*—Michael S Lebentritt
(74) *Attorney, Agent, or Firm*—Wells St. John P.S.

(57) ABSTRACT

Some embodiments include formation of at least one cavity in a first semiconductor material, followed by epitaxially growing a second semiconductor material over the first semiconductor material and bridging across the at least one cavity. The cavity may be left open, or material may be provided within the cavity. The material provided within the cavity may be suitable for forming, for example, one or more of electromagnetic radiation interaction components, transistor gates, insulative structures, and coolant structures. Some embodiments include one or more of transistor devices, electromagnetic radiation interaction components, transistor devices, coolant structures, insulative structures and gas reservoirs.

14 Claims, 28 Drawing Sheets

U.S. PATENT DOCUMENTS

| | | | |
|---|---|---|---|
| 5,923,046 A * | 7/1999 | Tezuka et al. | 257/24 |
| 6,010,921 A | 1/2000 | Soutome | |
| 6,037,634 A | 3/2000 | Akiyama | |
| 6,048,411 A | 4/2000 | Henley et al. | |
| 6,071,783 A | 6/2000 | Liang et al. | |
| 6,091,076 A | 7/2000 | Deleonibus | |
| 6,093,623 A | 7/2000 | Forbes | |
| 6,177,333 B1 | 1/2001 | Rhodes | |
| 6,204,524 B1 | 3/2001 | Rhodes | |
| 6,215,155 B1 | 4/2001 | Wollesen | |
| 6,245,636 B1 | 6/2001 | Maszara | |
| 6,255,731 B1 | 7/2001 | Ohmi et al. | |
| 6,265,327 B1 | 7/2001 | Kobayashi et al. | |
| 6,268,630 B1 | 7/2001 | Schwank et al. | |
| 6,313,014 B1 | 11/2001 | Sakaguchi et al. | |
| 6,340,829 B1 | 1/2002 | Hirano et al. | |
| 6,346,729 B1 | 2/2002 | Liang et al. | |
| 6,350,703 B1 | 2/2002 | Sakaguchi et al. | |
| 6,358,791 B1 | 3/2002 | Hsu et al. | |
| 6,403,485 B1 | 6/2002 | Quek et al. | |
| 6,410,938 B1 | 6/2002 | Xiang | |
| 6,433,401 B1 | 8/2002 | Clark et al. | |
| 6,509,613 B1 | 1/2003 | En et al. | |
| 6,512,244 B1 | 1/2003 | Ju et al. | |
| 6,531,375 B1 | 3/2003 | Giewont et al. | |
| 6,534,380 B1 | 3/2003 | Yamauchi et al. | |
| 6,541,861 B2 | 4/2003 | Higashi et al. | |
| 6,552,396 B1 | 4/2003 | Bryant et al. | |
| 6,552,496 B2 | 4/2003 | Yamazaki | |
| 6,610,615 B1 | 8/2003 | McFadden et al. | |
| 6,627,549 B2 | 9/2003 | Juengling | |
| 6,642,579 B2 | 11/2003 | Fung | |
| 6,649,959 B2 | 11/2003 | Hsu et al. | |
| 6,661,065 B2 | 12/2003 | Kunikiyo | |
| 6,664,146 B1 | 12/2003 | Yu | |
| 6,670,257 B1 * | 12/2003 | Barlocchi et al. | 438/422 |
| 6,680,243 B1 | 1/2004 | Kamath et al. | |
| 6,683,364 B2 | 1/2004 | Oh et al. | |
| 6,808,954 B2 | 10/2004 | Ma et al. | |
| 6,870,235 B2 * | 3/2005 | Abstreiter et al. | 257/414 |
| 7,023,051 B2 * | 4/2006 | Forbes | 257/347 |
| 7,029,989 B2 | 4/2006 | Kim et al. | |
| 7,153,753 B2 * | 12/2006 | Forbes | 438/404 |
| 7,378,704 B2 * | 5/2008 | Parekh | 257/296 |
| 7,416,943 B2 * | 8/2008 | Figura et al. | 438/259 |
| 7,498,265 B2 * | 3/2009 | Wells et al. | 438/700 |
| 2001/0020722 A1 | 9/2001 | Higashi et al. | |
| 2002/0011670 A1 | 1/2002 | Higashi et al. | |
| 2002/0034844 A1 | 3/2002 | Hsu et al. | |
| 2002/0048844 A1 | 4/2002 | Sakaguchi | |
| 2002/0070454 A1 | 6/2002 | Yasukawa | |
| 2002/0090816 A1 | 7/2002 | Ashby et al. | |
| 2002/0134503 A1 | 9/2002 | Hussinger et al. | |
| 2003/0085424 A1 | 5/2003 | Bryant et al. | |
| 2004/0124446 A1 | 7/2004 | Borger et al. | |
| 2004/0183078 A1 * | 9/2004 | Wang | 257/74 |
| 2005/0139952 A1 | 6/2005 | Koh | |
| 2005/0176222 A1 * | 8/2005 | Ogura | 438/514 |
| 2006/0043515 A1 | 3/2006 | Ford | |
| 2006/0207972 A1 * | 9/2006 | D'arrigo et al. | 216/67 |
| 2007/0032092 A1 | 2/2007 | Shibata et al. | |
| 2007/0249138 A1 | 10/2007 | Li et al. | |
| 2008/0048196 A1 | 2/2008 | Strittmatter et al. | |
| 2008/0085587 A1 | 4/2008 | Wells et al. | |
| 2008/0173964 A1 | 7/2008 | Akram | |
| 2008/0188051 A1 | 8/2008 | Wells | |

FOREIGN PATENT DOCUMENTS

| | | |
|---|---|---|
| EP | 1184897 A | 3/2002 |
| EP | 1427011 A | 6/2004 |
| WO | WO2007/074027 A1 | 7/2007 |
| WO | PCT/US2008/001126 | 2/2009 |

OTHER PUBLICATIONS

Yeo, et al., "A Partially Insulated Field-Effect Transistor (PiFET) as a Candidate of Scaled Transistors", IEEE Electron Device Letters, vol. 25, No. 6, Jun. 2004, pp. 387-389.

L. Jastrzebski, et al., "Device Characterization on Monocrystalline Silicon Growth Over $SiO_2$ by the ELO (Epitaxial Lateral Overgrowth) Process", IEEE Electron Device Letters, vol. EDL-4, No. 2, Feb. 1983, pp. 32-35.

Terada, et al., "A New DRAM Cell with a Transistor on a Lateral Epitaxial Silicon Layer (TOLE Cell)", IEEE Transactions on Electron Devices, vol. 37, No. 9, Sep. 1990, pp. 2052-2057.

Jurczak, et al., "Silicon-on-Nothing (SON)—an Innovative Process for Advanced CMOS", IEEE Transactions on Electron Devices, vol. 47, No. 11, Nov. 2000, pp. 2179-2187.

Sato, et al., "SON (Silicon on Nothing) MOSFET using ESS (Empty Space in Silicon) technique for SoC applications", IEEE, 2001, pp. 37.1.1-37.1.4.

PCT/US2007/016150, filed Apr. 9, 2008, Search Report.

PCT/US2007/016150, filed Apr. 9, 2008, Written Opinion.

Bashir, R., et al., "Characterization of sidewall defects in selective epitaxial growth of silicon" J. Vac. Sci. Technol. B 13(23), May/Jun. 1995, pp. 923-927.

Bashir, R., et al. "Reduction of sidewall defect induced leakage currents by the use of nitrided field oxides in silicon selective epitaxial growth isolation for advanced ultralarge scale integration" J.Vac. Sci. Technol. B 18(2), Mar./Apr. 2000, pp. 596-699.

Bernstein, et al., Chapter 3: "SOI Device Electrical Properties" § 3.4 Floating Body Effects, SOI Circuit Design Concepts, pp. 34-53 (Kluwer Academic Publishers, pre-Aug. 2001).

Fitzgerald, E.A., et al., "Dislocation Engineering in Strained MOS Materials" IEEE, 4 pages (2005).

Hammad et al., "The Pseudo-Two Dimensional Approach to Model the Drain Section in SIO MOSFETs", IEEE Transactions on Electron Devices, vol. 48, No. 2, pp. 386-387 (Feb. 2001).

Mendis, et al. "CMOS Active Pixel Image Sensor, IEEE Transactions on Electron Devices", vol. 41, No. 3, pp. 452-453, (Mar. 1994).

Nixon et al. "256×256 CMOS Active Pixel Sensor Camera-on-Chip", IEEE Journal of Solid-State Circuits, vol. 31, No. 12, pp. 2045-2050 (Dec. 1996).

Abstract: Parng, S.H. , et al. "DNA Extraction With Parallel Electrodes on Microfluidic System," Technical Proceedings of the 2006 NSTI Nanotechnology Conference and Trade Show, vol. 2, Chapter 8, 1 page (2006).

Seethaler, S., "Nanopore method could revolutionize genome sequencing" EureAlert!, 2 pages (Apr. 6, 2006).

Simonite, T., "Nanopore will make for speedy DNA sequencing", NewScientist Tech, 3 pages (Apr. 10, 2006).

Sivagnaname et al., Stand-by-Current in PD-SOI Pseudo-nMOS Circuits, IEEE, pp. 94-96 (2003).

Wang, et al., "Achieving Low Junction Capacitance on Bulk SI MOSFET Using SDOI Process" Micron Technology, Inc., 12 pages (pre-2004).

Wang, et al. "Nanofluidic channels fabrication and manipulation of DNA molecules", IEEE Proc.-Nanobiotechnol., vol. 153, No. 1, pp. 11-15 (Feb. 2006).

Forbes, D.V., et al., "The effect of reactor pressure on selective are epitaxy of GaAs in a close-coupled showerhead reactor" Journal of Crystal Growth, 261, 2004, pp. 427-432.

Guo, L. Jay, et al., "Fabrication of Size-Controllable Nanofluidic Channels by Nanoimprinting and Its Application for DNA Stretching" Nano Letters, vol. 4, No. 1, 2004, pp. 69-73.

Mazure, C., et al., "Advanced SOI Substrate Manufacturing" IEEE International Conference on Integrated Circuit Design and Technology, 2004, pp. 105-110.

Selvaganapathy, Ponnambalm Ravi, et al., "Recent Progress in Microfluidic Devices for Nucleic Acid and Antibody Assays", Proceedings of the IEEE, vol. 91, No. 6, Jun. 2003, pp. 954-375.

Wittkower, Andrew, "Smartcut® Technology for SOI: A new high volume application for ion implantation" IEEE, 2000, pp. 269-272.

* cited by examiner

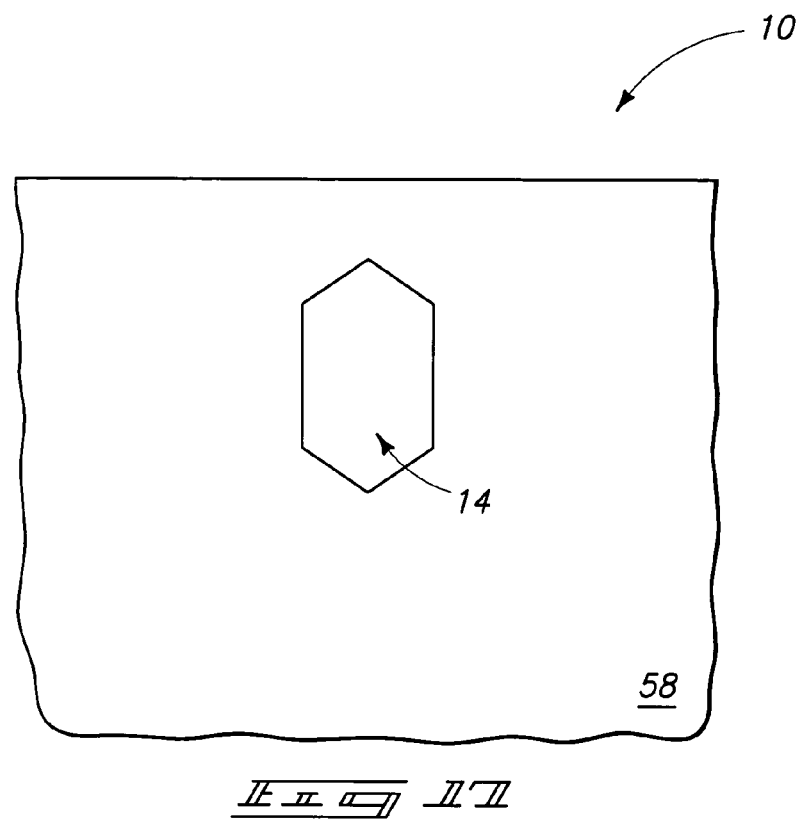
F I G 17
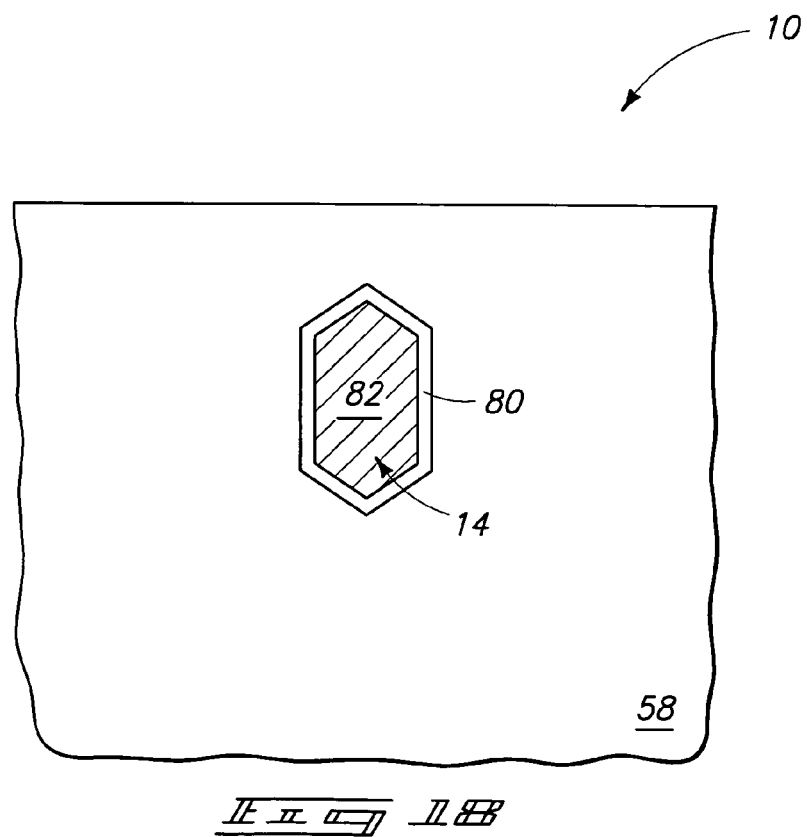
F I G 18

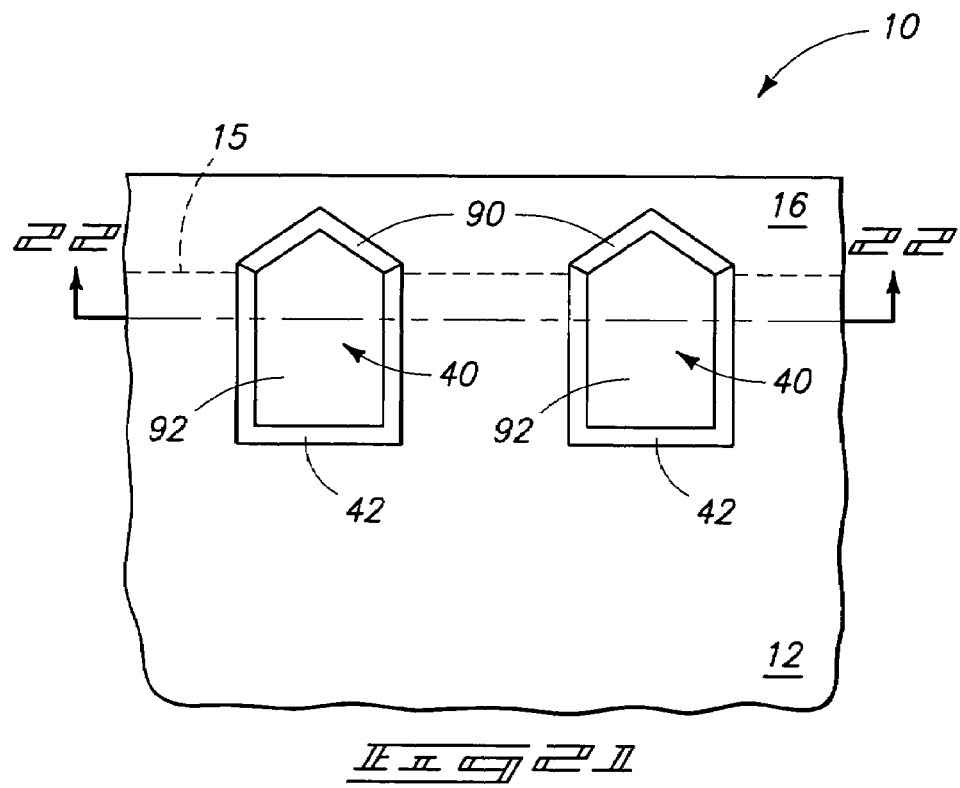
F I G 21
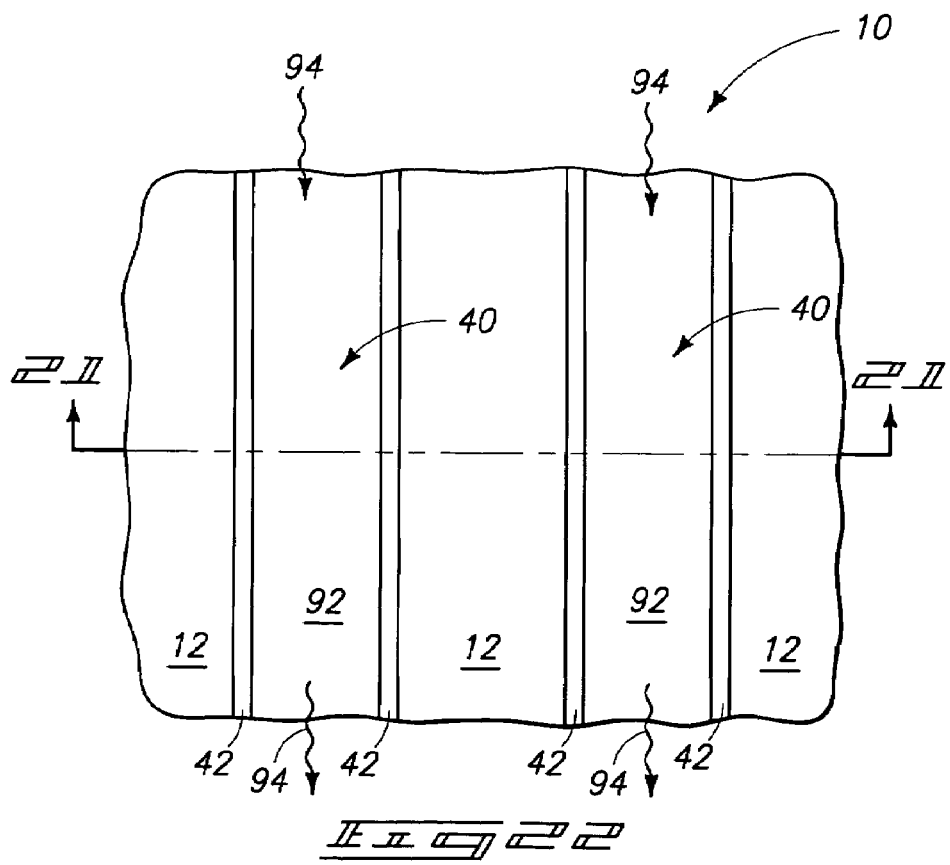
F I G 22

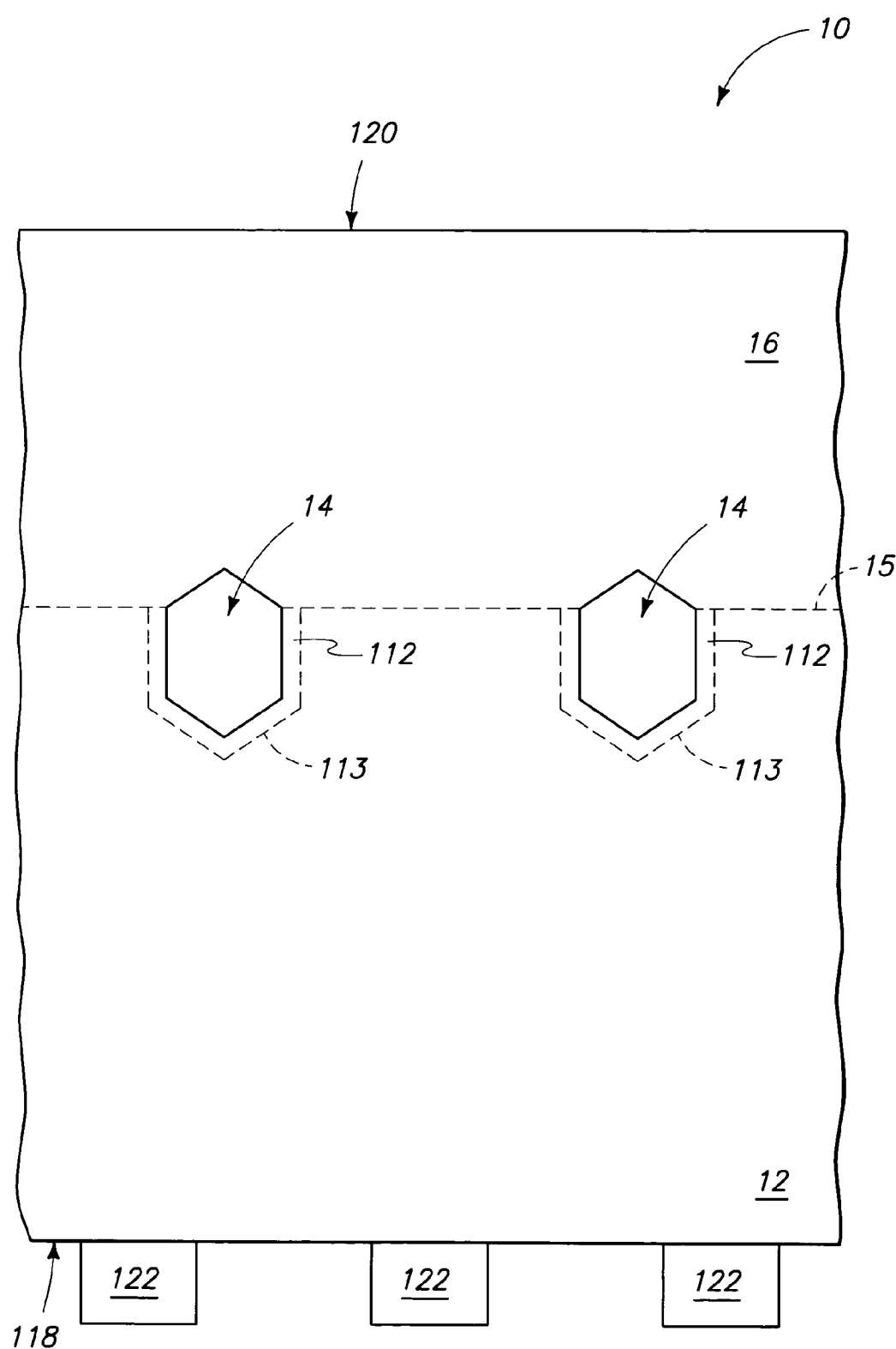
FIG. 3III

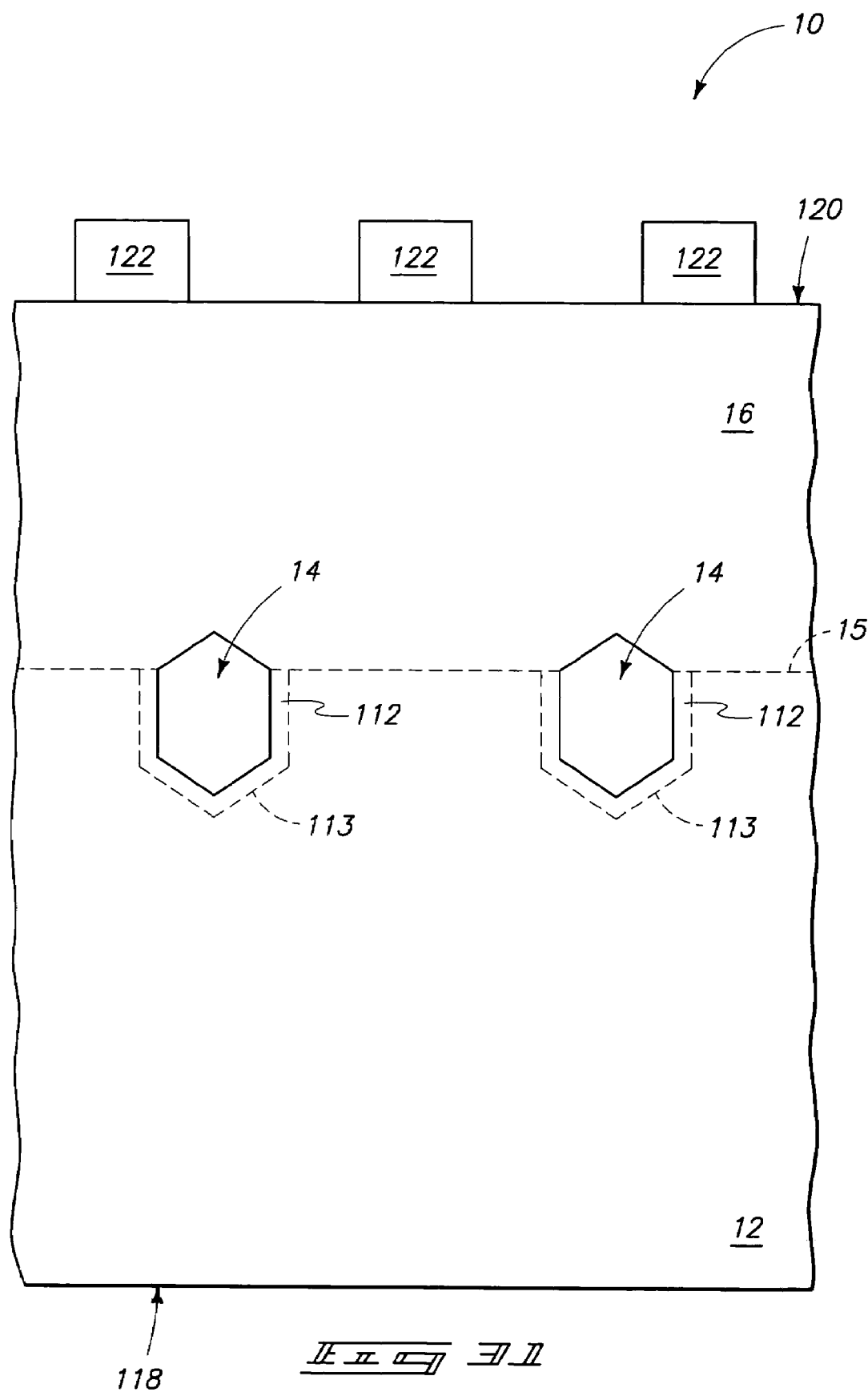

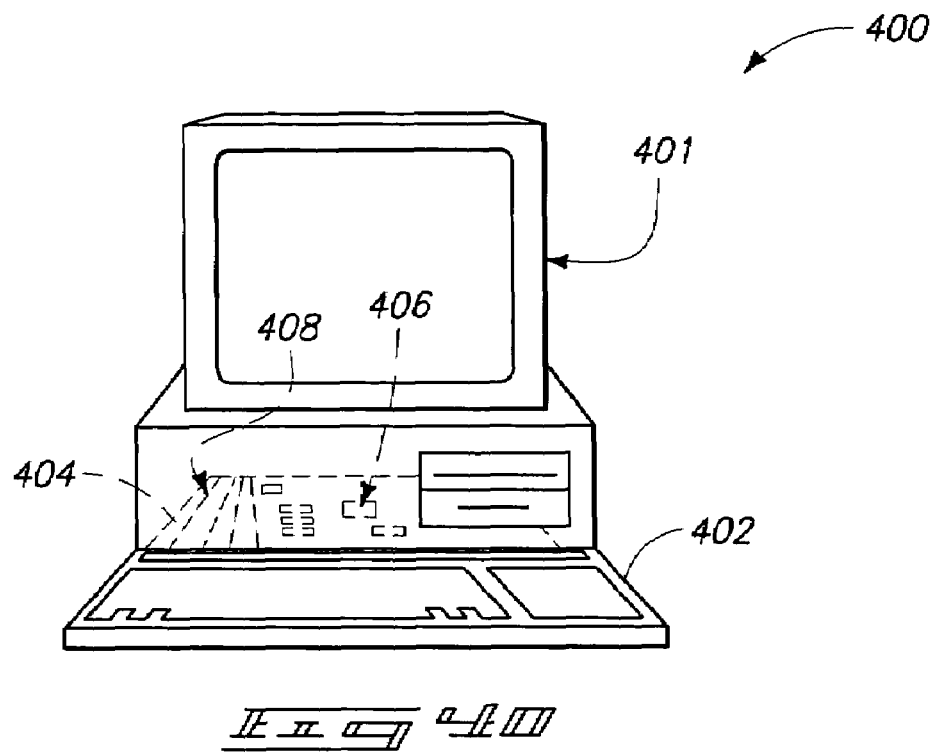
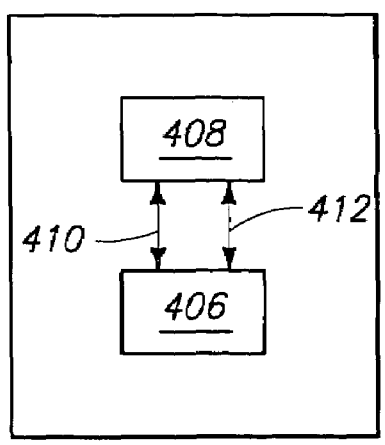

METHODS OF FORMING TRANSISTOR DEVICES

TECHNICAL FIELD

The technical field pertains to integrated circuitry, electromagnetic radiation interaction components, transistor devices and semiconductor constructions; and to methods of forming integrated circuitry, electromagnetic radiation interaction components, transistor devices and semiconductor constructions.

BACKGROUND

A continuing goal of semiconductor device fabrication is to conserve semiconductor wafer real estate (in other words, to achieve high integration) while maintaining integrity and desired performance characteristics of semiconductor devices. Such has led to development and improvement of various semiconductor constructions, including, for example, recessed access devices (RADs), and partial silicon-on-insulator (partial-SOI) constructions.

Another goal of semiconductor device fabrication is to apply semiconductor fabrication technologies to development of a diversity of microstructures. Such has led to development of optical waveguides fabricated in semiconductor materials; and to development of micro-electro-mechanical systems (MEMS).

BRIEF DESCRIPTION OF THE DRAWINGS

FIG. 2 is along the line 2-2 of FIG. 1.

FIG. 4 is along the line 4-4 of FIG. 3.

FIG. 6 is along the line 6-6 of FIG. 5.

FIG. 17 is a cross-sectional view of a fragment of a monocrystalline semiconductor material at a preliminary processing stage of an embodiment.

FIGS. 18-20 are views of the FIG. 17 fragment shown at processing stages subsequent to that of FIG. 17.

FIGS. 21 and 22 are a three-dimensional view and a cross-sectional view, respectively, of an example electromagnetic radiation interaction component. FIG. 22 is along the line 22-22 of FIG. 21; and FIG. 21 is along the line 21-21 of FIG. 22.

FIGS. 27-31 are views of the FIG. 26 fragment shown at processing stages subsequent to that of FIG. 26.

FIGS. 32 and 33 are a three-dimensional view and a cross-sectional view, respectively, of a coolant channel embodiment. FIG. 32 is along the line 32-32 of FIG. 33; and FIG. 33 is along the line 33-33 of FIG. 32.

FIG. 40 is a diagrammatic view of a computer embodiment.

FIG. 41 is a block diagram showing particular features of the motherboard of the FIG. 40 computer embodiment.

DETAILED DESCRIPTION OF THE PREFERRED EMBODIMENTS

In some embodiments, openings are formed to be entirely contained in at least one semiconductor material. The openings may be at least partially filled with material, or left empty. The openings may be used for fabrication of, for example, one or more of coolant channels, electromagnetic radiation interaction components, partial SOI, gettering regions, stress-inducing regions, solar cells and bottom gates of field effect transistors.

FIGS. 1-6 illustrate an embodiment for forming openings that are entirely contained within semiconductor material.

Figure 1:
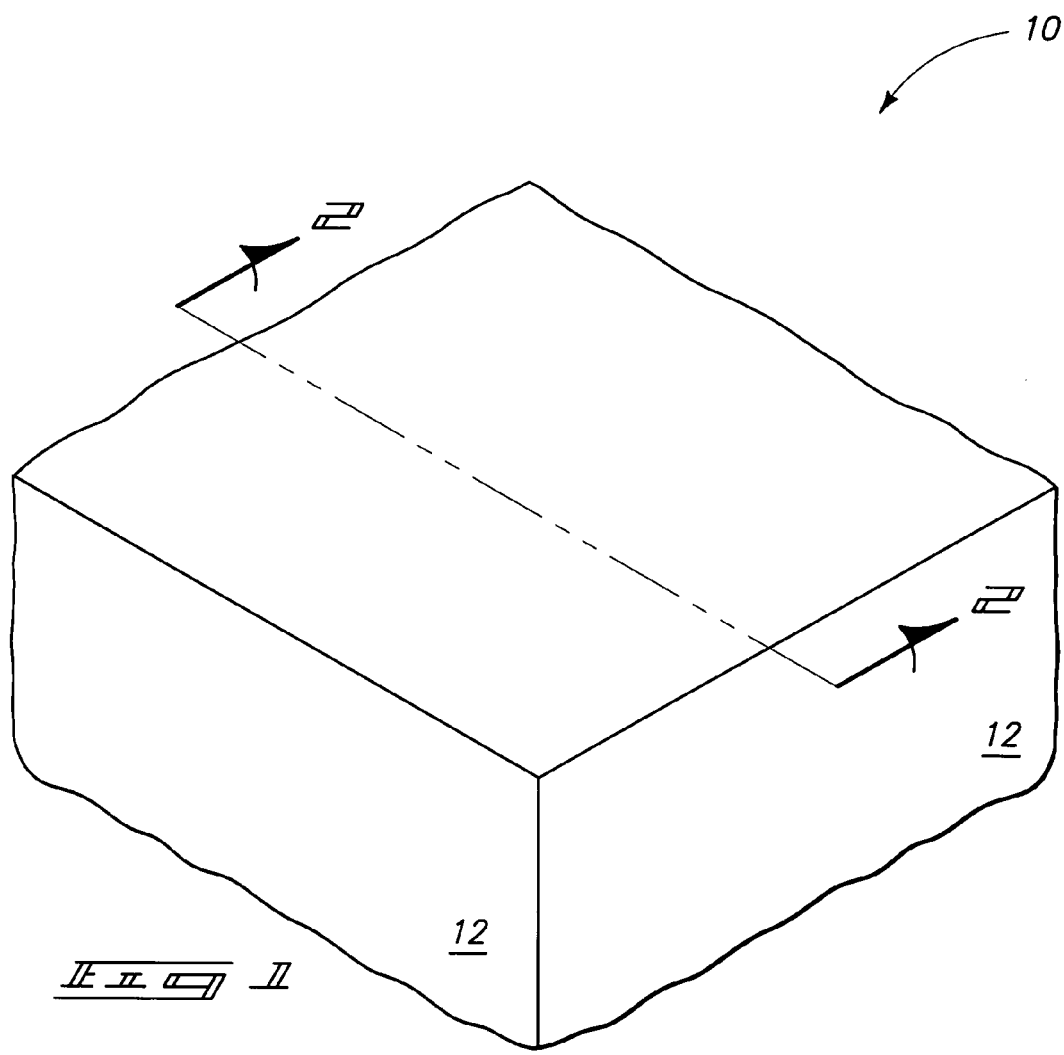
FIGS. 1 and 2 are a three-dimensional view and a cross-sectional view, respectively, of a fragment of a monocrystalline semiconductor material at a preliminary processing stage of an embodiment.
Figure 2:
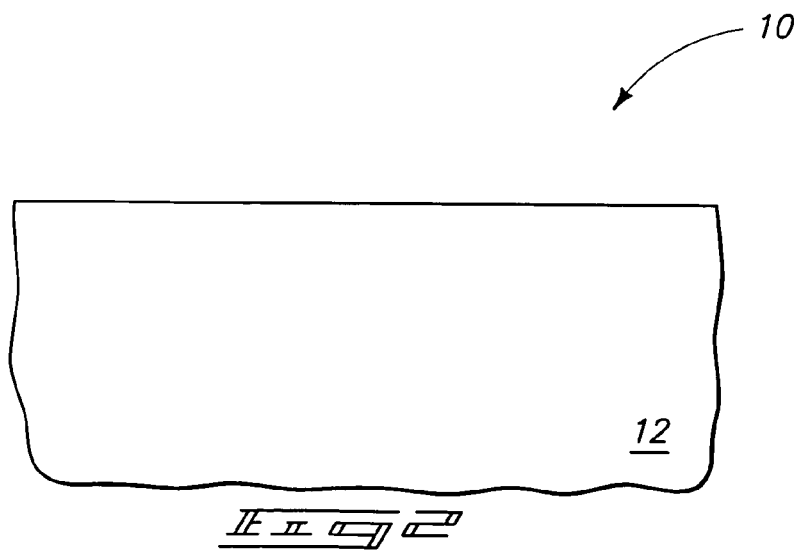

Referring initially to FIGS. 1 and 2, a fragment of a semiconductor substrate 10 is illustrated in three-dimensional view and cross-sectional view. The semiconductor substrate comprises semiconductor material 12. Such material may comprise, consist essentially of, or consist of one or more of Si, Ge, Ga, Ga/Al, Si/Ge, Ga/As, SiC, and Ga/Al/N, and may be monocrystalline. For instance, semiconductor material 12 may be monocrystalline silicon, and substrate 10 may be a monocrystalline silicon wafer. To aid in interpretation of the claims that follow, the terms "semiconductive substrate" and "semiconductor substrate" are defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

Figure 3:
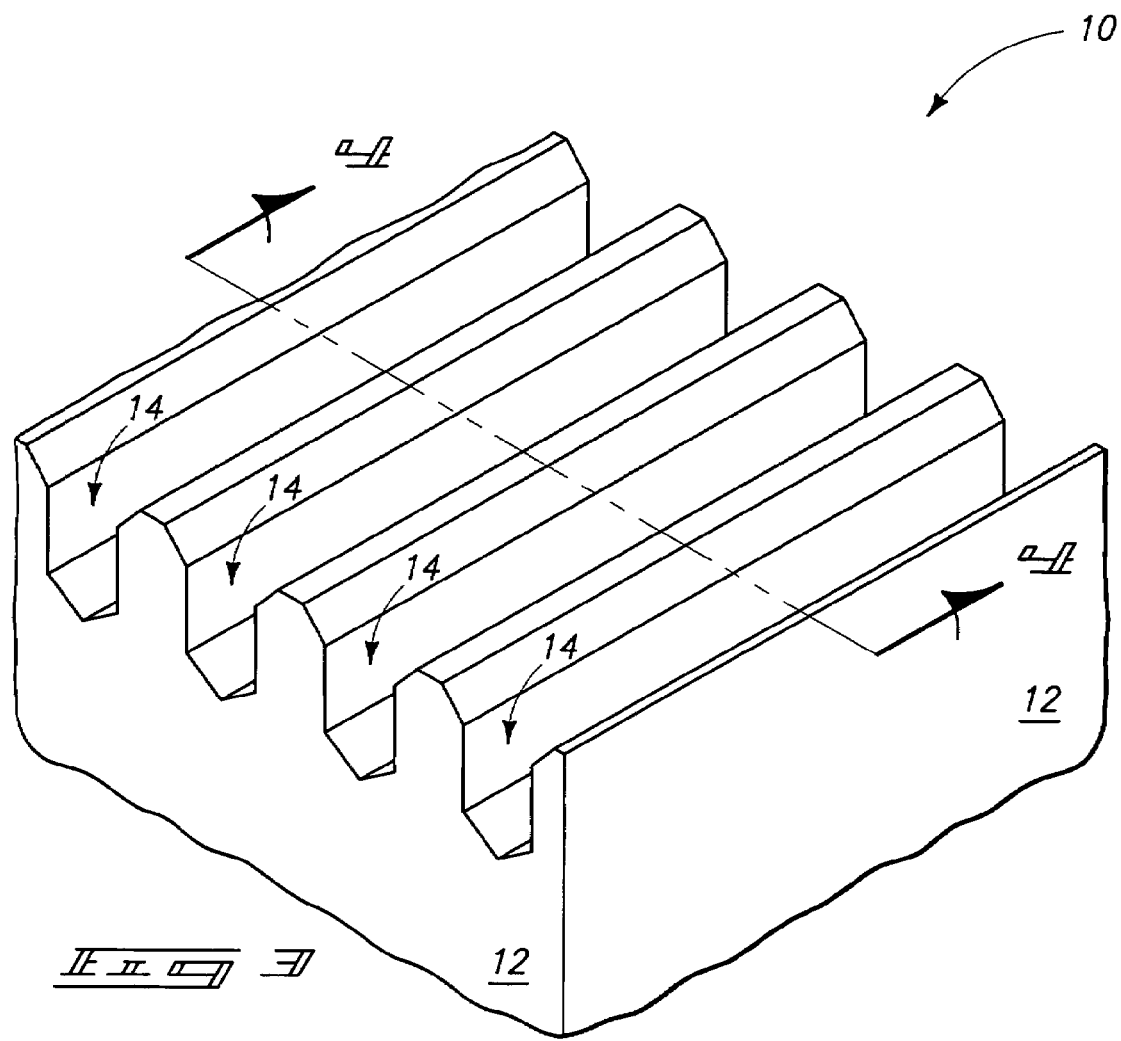
FIGS. 3 and 4 are views of the fragment of FIGS. 1 and 2 shown at a processing stage subsequent to that of FIGS. 1 and 2.
Figure 4:
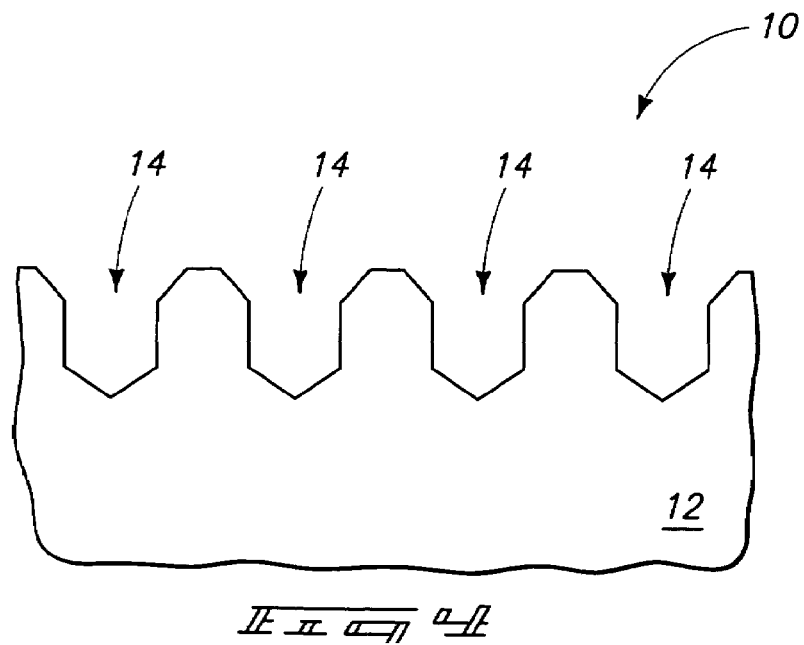

Referring to FIGS. 3 and 4, openings (specifically, trenches) 14 are formed to extend into semiconductor material 12. Trenches 14 may be formed with any suitable processing. For instance, a patterned mask (not shown) may be formed over material 12 to define locations of trenches 14, the trenches may then be etched into material 12 with one or more suitable etches, and the mask subsequently removed to leave the structure of FIGS. 3 and 4. The mask may, for example, comprise silicon nitride over a pad oxide. The etch utilized to penetrate into material 12 may comprise either an anisotropic etch, or a combination of anisotropic and isotropic etches. In an example embodiment, semiconductor material 12 is monocrystalline silicon. Examples of anisotropic etches suitable for etching into monocrystalline silicon are a reactive ion etch using HBr, $SF_6$ and $O_2$; and a reactive ion etch using HBr and chlorine. Examples of isotropic etches suitable for etching into monocrystalline silicon are wet, or vapor phase, etches using one or more of $NH_4OH$, KOH and tetramethylammonium hydroxide (TMAH).

Figure 8:
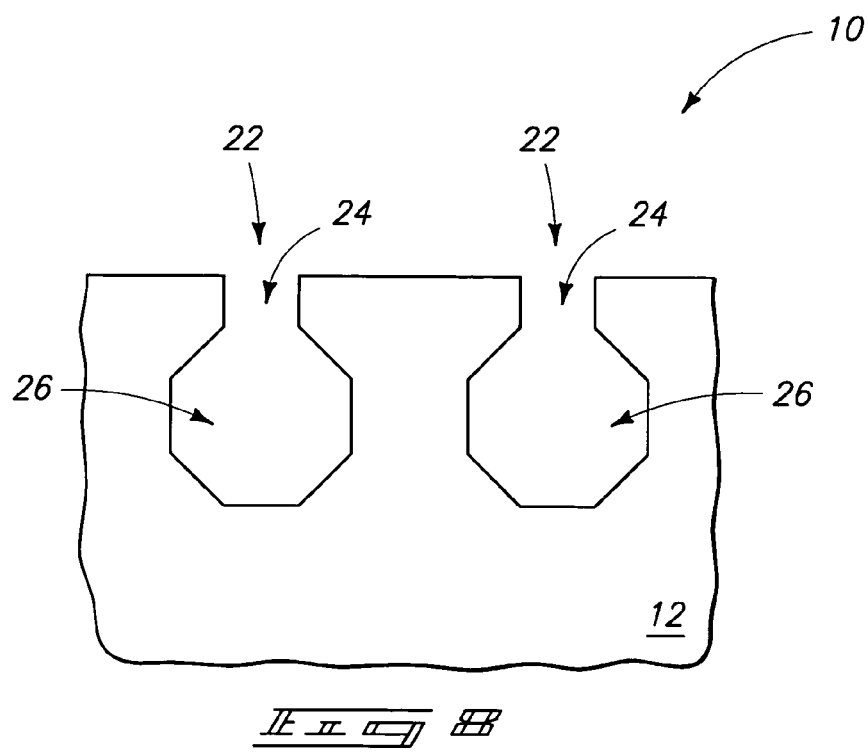
FIG. 8 is a cross-sectional view of a fragment of a monocrystalline semiconductor material at a preliminary processing stage of an embodiment.

In some embodiments, the etch can utilize an anisotropic etch to form a trench, followed by an isotropic etch to form bowl regions beneath the trench (an example of such embodiment is shown in FIG. 8). Spacers can be provided along sidewalls of the anisotropically etched trench prior to the isotropic etching. Such spacers can protect the sidewalls of the trench during the isotropic etching, which can enable undercutting of the trench to form structures like that shown in FIG. 8. The spacers can be formed by depositing a layer of spacer material within the trench, and then anisotropically etching the spacer material to remove the material from the bottom of the trench while leaving the material along the sidewalls. The spacer material can comprise, for example, $SiO_2$ or $Si_3N_4$.

In some embodiments, the trenches 14 may be formed along 100 planes within a monocrystalline silicon material 12.

The embodiment of FIGS. 3 and 4 forms four trenches 14 into substrate 12. In other embodiments, more than four trenches or less than four trenches may be formed. Also, opening shapes other than trenches may be formed. Generally, at least one opening will be formed at the processing stage of FIGS. 3 and 4. An opening formed at the processing stage of FIGS. 3 and 4 may be alternatively referred to as a cavity.

Figure 5:
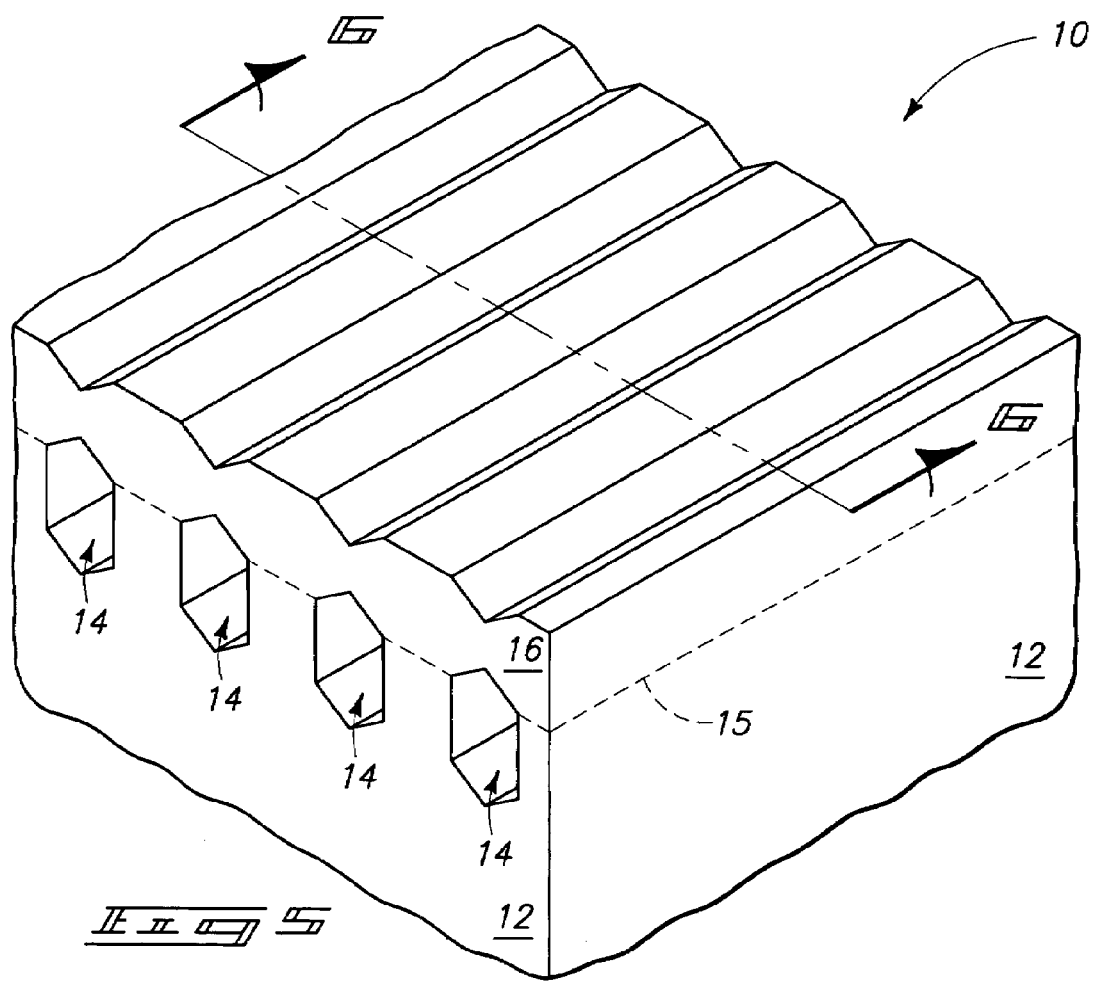
FIGS. 5 and 6 are views of the fragment of FIGS. 1 and 2 shown at a processing stage subsequent to that of FIGS. 3 and 4.
Figure 6:
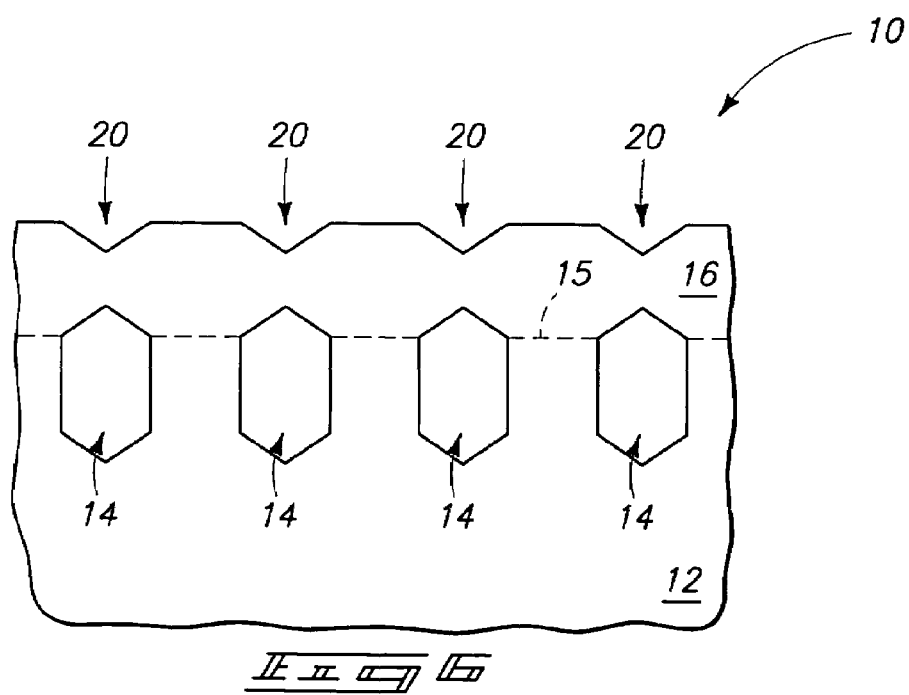

Referring to FIGS. 5 and 6, a semiconductor material 16 is epitaxially grown over semiconductor material 12. Semiconductor material 16 extends across openings 14 (FIGS. 3 and 4) and bridges over the openings so that the openings are now entirely contained in semiconductor materials 12 and 16. The bridging may occur more quickly than filling of the openings due to a higher rate of deposition at the tops of the openings than within the openings. Low defectivity (in other words, low amounts of defects) in crystalline semiconductor materials may be enhanced by having the sidewalls of the openings aligned to a <100> crystal orientation.

In some embodiments, semiconductor materials 12 and 16 may both be entirely monocrystalline, and thus openings 14 may be entirely contained within monocrystalline material.

The openings remaining at the processing stage of FIGS. 5 and 6 may be referred to as conduits. Such conduits may be considered to be contained in, and extend through, a semiconductor structure comprising the combined semiconductor materials 12 and 16.

Semiconductor material 16 may comprise any suitable composition, and may, for example, comprise, consist essentially of, or consist of one or more of Si, Ge, Ga, Ga/Al, Si/Ge, Ga/As, SiC, and Ga/Al/N. In some embodiments, semiconductor materials 12 and 16 may comprise the same composition as one another, and in other embodiments semiconductor materials 12 and 16 may differ in composition from one another.

Semiconductor materials 12 and 16 may be referred to as first and second semiconductor materials, respectively, to distinguish the semiconductor materials from one another. A dashed line 15 is provided in FIGS. 5 and 6 to illustrate an approximate boundary between the first and second semiconductor materials 12 and 16. If materials 12 and 16 are the same composition as one another, the materials may merge to form a common material.

Semiconductor material 16 may be formed with any suitable processing. For instance, material 16 may be monocrystalline silicon epitaxially grown at a temperature of from about 700° C. to about 1000° C., and a pressure of from about 10 Torr to about 200 Torr, utilizing one or more of dichlorosilane, $H_2$, HCl and $Cl_2$.

Figure 7:
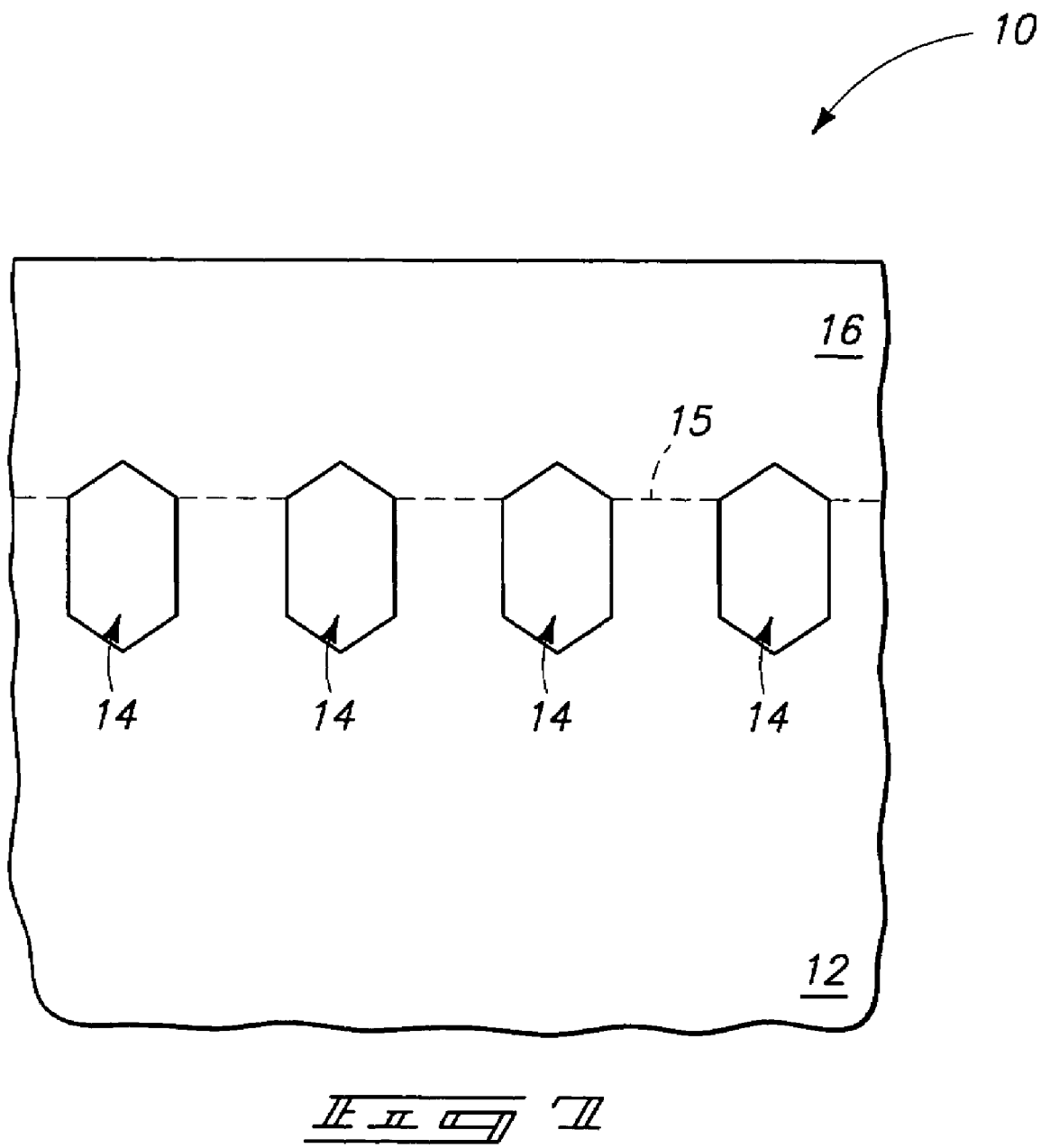
FIG. 7 is a view of the fragment of FIG. 2 shown at a processing stage subsequent to that of FIG. 6.

The epitaxial growth of second semiconductor material 16 may form the second semiconductor material to have very few defects, and in some embodiments may form the second semiconductor material to have no detectable defects. The epitaxial growth will proceed along particular crystalline lattices, as discussed in more detail with reference to FIG. 10. Such may lead to the second semiconductor material initially having trenches, or troughs, 20 directly over the openings 14. The troughs 20 will initially be relatively deep, and then will become increasingly shallow with further epitaxial growth of semiconductor material 16. FIG. 7 shows substrate 10 at a processing stage subsequent to FIG. 6, and after enough growth of semiconductor material 16 has occurred to eliminate troughs 20 (FIG. 6). The methodology of FIGS. 1-7 may be particularly easy to scale for increasing integration. The divots over the initial trenches get smaller as feature sizes go down, so that planarity improves as devices are scaled for increased integration.

The openings 14 shown in FIGS. 3 and 4 are one example of a shape of openings that may be formed within substrate 12. Any shape may be formed which is suitable for a desired application. FIG. 8 shows openings 22 formed within substrate 12 to have a different shape than the openings 14. The openings 22 have an upper stem region 24 which leads to a bowl region 26. Openings 22 may be formed by, for example, forming a patterned mask (not shown) over substrate 12 with openings extending therethrough in locations where openings 22 are ultimately to be formed. The openings 22 may be formed into substrate 12 with an anisotropic etch to form stem regions 24, followed by an isotropic etch to form bowl regions 26. The mask may then be removed to leave the structure of FIG. 8.

Figure 9:
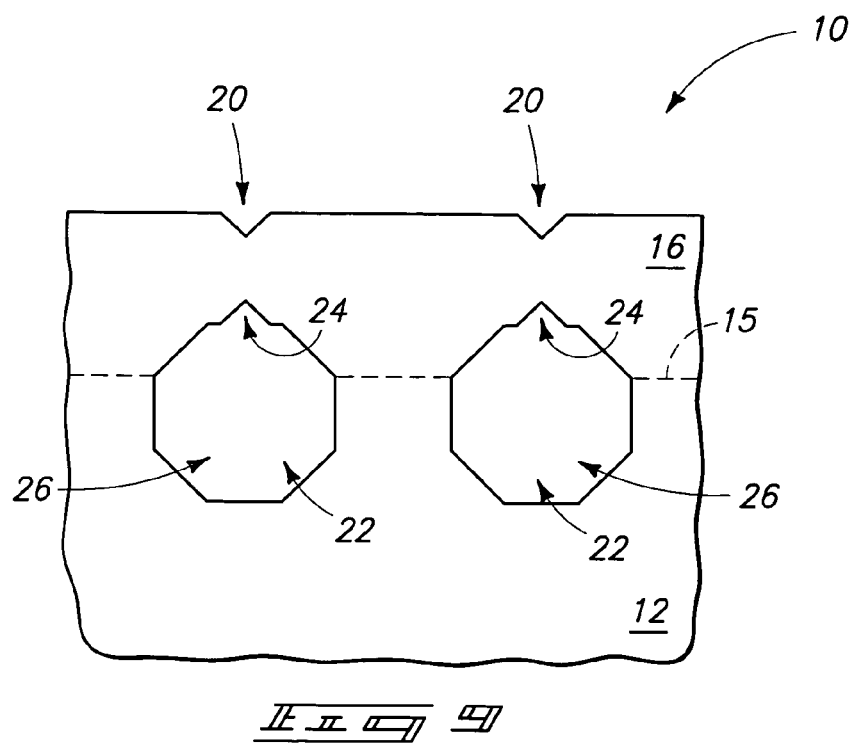
FIG. 9 is a view of the FIG. 8 fragment shown at a processing stage subsequent to that of FIG. 8.

FIG. 9 diagrammatically illustrates second semiconductor material 16 epitaxially grown over first semiconductor material 12 and across openings 22. The second semiconductor material 16 bridges across the openings so that the openings of FIG. 9 are entirely contained within semiconductor materials 12 and 16. The stem regions 24 are shown pinched closed at the processing stage of FIG. 9. The epitaxial growth of second semiconductor material 16 is shown leaving troughs 20 over openings 22.

Integrated circuitry may be formed over substrate 10 in subsequent processing (discussed in more detail below). The openings formed in the semiconductor material (for instance, openings 14 of FIGS. 6 and 7, or openings 22 of FIG. 9) may ultimately be utilized, for example, to contain integrated circuit devices, to define electromagnetic radiation interaction components, to define insulative regions of partial-SOI, to define gettering regions, and to form coolant channels. Some efforts have been made to achieve some of these functions with prior art processes in which openings are formed in semiconductor substrates. However, the prior art processes typically use films or patterned masks of oxide, nitride, SiGe, etc., adjacent the openings. Such films may cause defects in semiconductor material due to, for example, lattice mismatches during temperature cycles. In some embodiments, avoidance of prior art films and patterned masks adjacent openings in monocrystalline silicon may reduce defect densities that would otherwise occur in the monocrystalline silicon.

Figure 10:
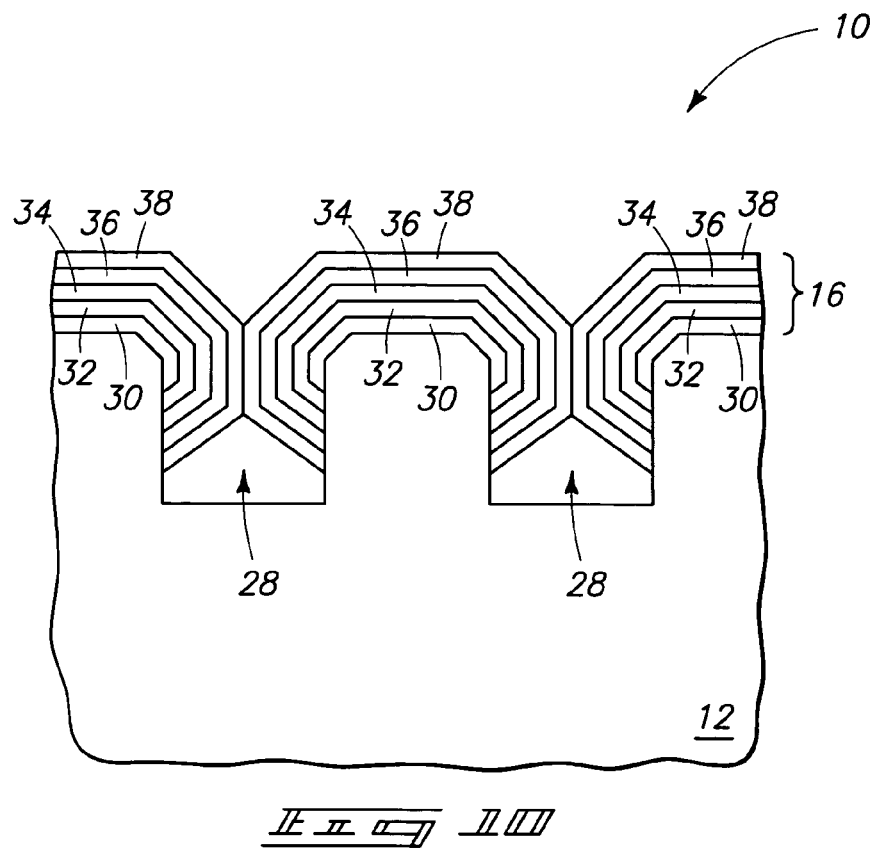
FIG. 10 is a cross-sectional view of a fragment of a monocrystalline semiconductor material shown at an intermediate processing stage of an embodiment.

FIG. 10 diagrammatically illustrates epitaxial growth of a second semiconductor material 16 over a first semiconductor material 12 to assist the reader in understanding subject matter described herein. FIG. 10 shows growth of the second semiconductor material 16 across openings 28 to form bridges over the openings.

The material 12 may be a monocrystalline material, and the material 16 may then grow as layers 30, 32, 34, 36 and 38 along crystalline planes of the monocrystalline material. The growing layers from opposing sides of an opening ultimately merge over the opening to form the bridge across the opening.

The growing layers of material 16 may penetrate to a depth within the openings, as shown in FIG. 10. In other embodiments, the growing semiconductor material may be precluded from penetrating into the openings with liners that cover at least portions of interior peripheries of the openings. In some embodiments, a depth to which material 16 penetrates into the openings may be tailored by provided liners of particular size and/or composition within the openings.

Figure 11:
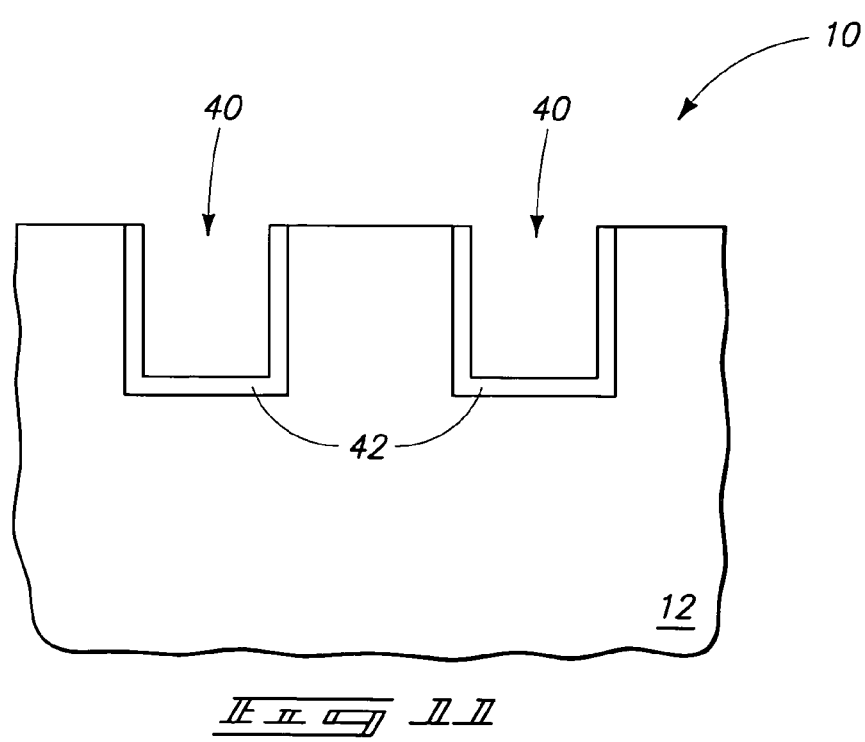
FIG. 11 is a cross-sectional view of a fragment of a monocrystalline semiconductor material at a preliminary processing stage of an embodiment.

FIG. 11 shows substrate 10 having a pair of openings 40 extending into semiconductor material 12, and having liners 42 formed along inner peripheries of the openings. The liners may comprise any suitable composition or combination of compositions. In some embodiments, the liners may comprise electrically insulative material. For instance, the liners may comprise, consist essentially of, or consist of one or both of silicon dioxide and silicon nitride. The openings may be trenches extending into and out of the plane of the cross-section of FIG. 11 in some embodiments.

The liners 42 are only within the openings, rather than also being over an upper surface of material 12. Such construction may be formed by: initially forming a layer of liner material across an upper surface of substrate 12 and within the openings; and then planarizing the layer (using, for example, chemical-mechanical polishing), or etching the layer (using for example, a dry spacer etch) to remove the layer from over an upper surface of semiconductor material 12 while leaving the layer within the openings.

Figure 12:
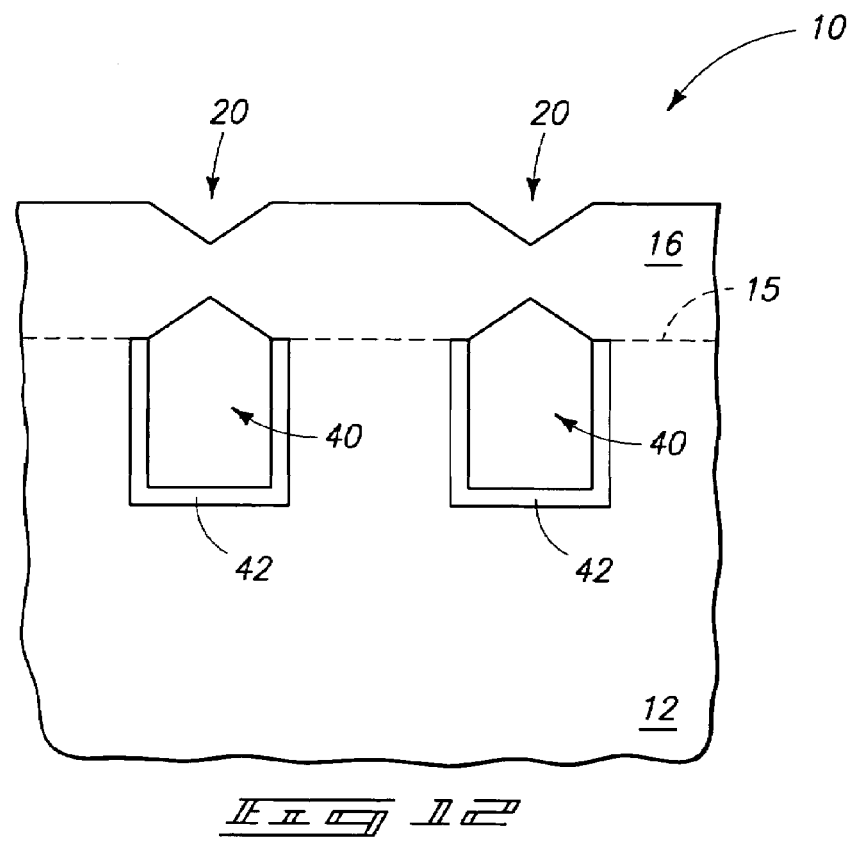
FIG. 12 is a view of the FIG. 11 fragment shown at a processing stage subsequent to that of FIG. 11.

FIG. 12 shows substrate 10 after second semiconductor material 16 is epitaxially grown over first semiconductor material 12. The second semiconductor material forms bridges (or caps) across openings 14. Thus, the openings remaining at the processing stage of FIG. 12 are entirely contained within semiconductor materials 12 and 16. The contained openings may be conduits extending into and out of the plane of the cross-section of FIG. 12.

Layers 42 within the openings preclude epitaxial growth from peripheries of the openings. This may allow for control of the size and shape of the openings remaining within semiconductor materials 12 and 16 beyond that achievable without utilization of layers 42.

Figure 13:
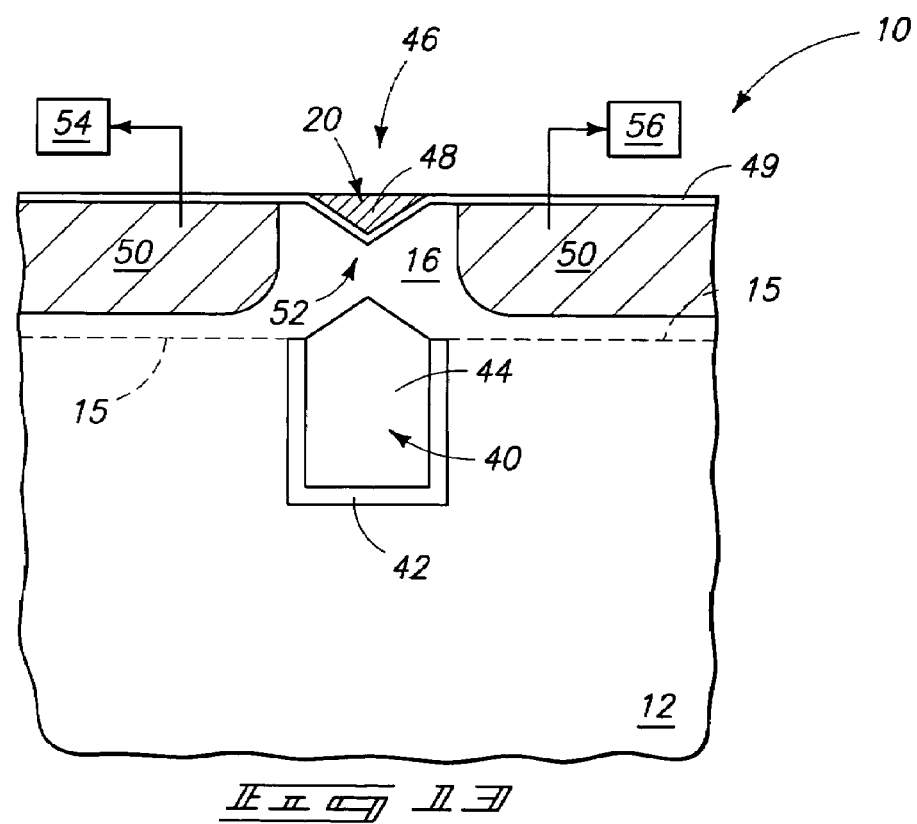
FIG. 13 is a cross-sectional view of a recessed access device embodiment.

The embodiment of FIG. 12 shows troughs 20 remaining over openings 40. Recessed access devices (RADs) may be formed within troughs 20, as shown in FIG. 13. More specifically, FIG. 13 shows a recessed access device 46 having gate within trough 20.

Opening 40 may be left empty, or may have dielectric material provided therein. FIG. 13 shows dielectric material 44 within opening 40. Dielectric material 44 may be formed within opening 40 by exposing a region of the opening, and then depositing dielectric material through the exposed region to at least partially fill the opening. Alternatively, dielectric material 44 may be deposited within the opening prior to epitaxial growth of semiconductor material 16.

The dielectric material 44 may comprise the same composition as layer 42, or a different composition. In some embodiments, dielectric material 44 may comprise, consist essentially of, or consist of one or both of silicon dioxide and silicon nitride.

Gate dielectric 49 is formed across an upper surface of semiconductor material 16, and within trough 20. Gate dielectric 49 may comprise any suitable composition or combination of compositions. In some embodiments, dielectric material 49 may comprise, consist essentially of, or consist of silicon dioxide.

Electrically conductive gate material 48 is formed over dielectric material 49 and within trough 20. The gate material may be formed to be only within the trough by, for example: initially forming the gate material as a layer across an upper surface of semiconductor material 16; and subsequently patterning the layer of gate material so that the gate material remains only within the trough. The gate material would typically be patterned to be a wordline extending orthogonally relative to cross-sectional view of FIG. 13.

The gate material may be entirely contained within the trough as shown in FIG. 13. In other embodiments, the gate material may extend outward of the trough. Specifically, the gate material may extend laterally outward of the trough and/or vertically outward of the trough.

Gate material 48 may comprise any suitable composition or combination of compositions, including, for example, one or more of metals, metal compositions, and conductively-doped semiconductor material.

A pair of source/drain regions 50 are formed within semiconductor material 16 on opposing sides of gate material 48. A channel region 52 is formed laterally between the source/drain regions, and vertically between the gate material 48 and the opening 40. The source/drain regions may be formed by implanting suitable conductivity-enhancing dopant into semiconductor material 16. Such dopant may include one or both of n-type and p-type dopant. The channel region may be formed by implanting an appropriate threshold voltage dopant into semiconductor material 16.

Although the source/drain regions are shown to extend only within semiconductor material 16, it is to be understood that the source/drain regions may also extend through material 16 and into material 12.

One of the source/drain regions may be electrically connected to a bitline 54 and the other may be electrically connected to a charge storage device (such as, for example, a capacitor) 56. Accordingly, RAD 46 may be incorporated into a dynamic random access memory (DRAM) unit cell. A plurality of such unit cells may be simultaneously fabricated to form a DRAM array. In other embodiments, RAD 46 may be incorporated into a static random access memory (SRAM) unit cell, and such unit cell may be part of an SRAM array.

There may be advantages to having dielectric material 44 directly beneath transistor gate material 48, such as, for example, full channel depletion (as with SOI wafers) and/or improved leakage current, which can allow lower power devices. The advantages may be of particular benefit in embodiments in which RAD 46 is incorporated into an SRAM unit cell.

Openings having dielectric material therein may be provided beneath channel regions of numerous types of transistor devices in various embodiments. For instance, FIGS. 14 and 15 illustrate a process for providing such openings beneath a channel region of a planar field effect transistor.

Figure 14:
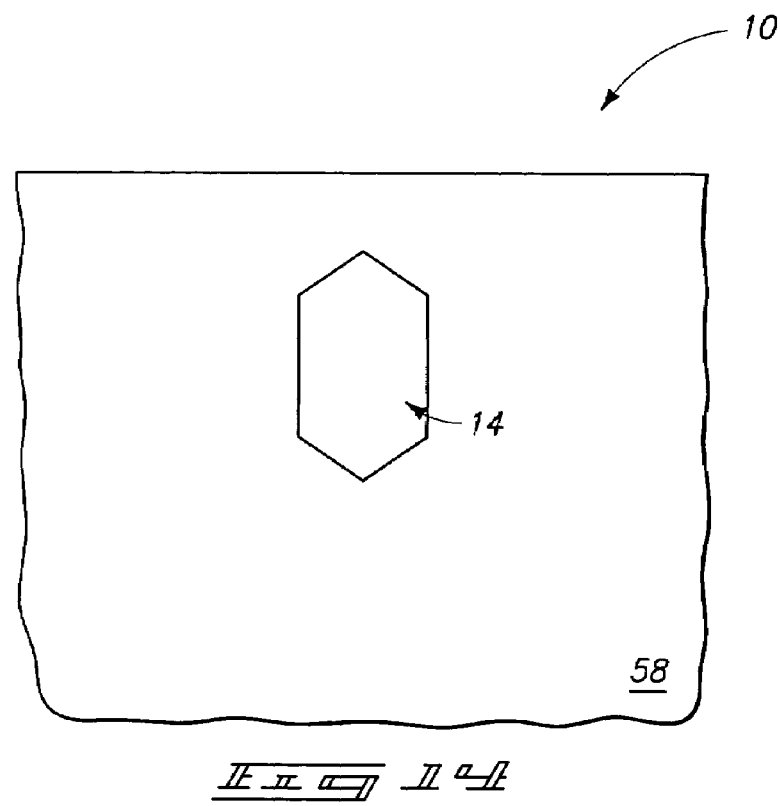
FIG. 14 is a cross-sectional view of a fragment of a monocrystalline semiconductor material at a preliminary processing stage of an embodiment.

FIG. 14 shows a segment of a substrate 10 at a processing stage analogous to that discussed above with reference to FIG. 7. The substrate of FIG. 14 is shown to comprise a single semiconductor material 58. Such single semiconductor material may correspond to merged materials 12 and 16 of FIG. 7 in an embodiment in which material 12 and 16 are the composition as one another. For instance, material 58 may comprise, consist essentially of, or consist of monocrystalline silicon. An opening 14 is entirely contained within semiconductor material 58.

Figure 15:
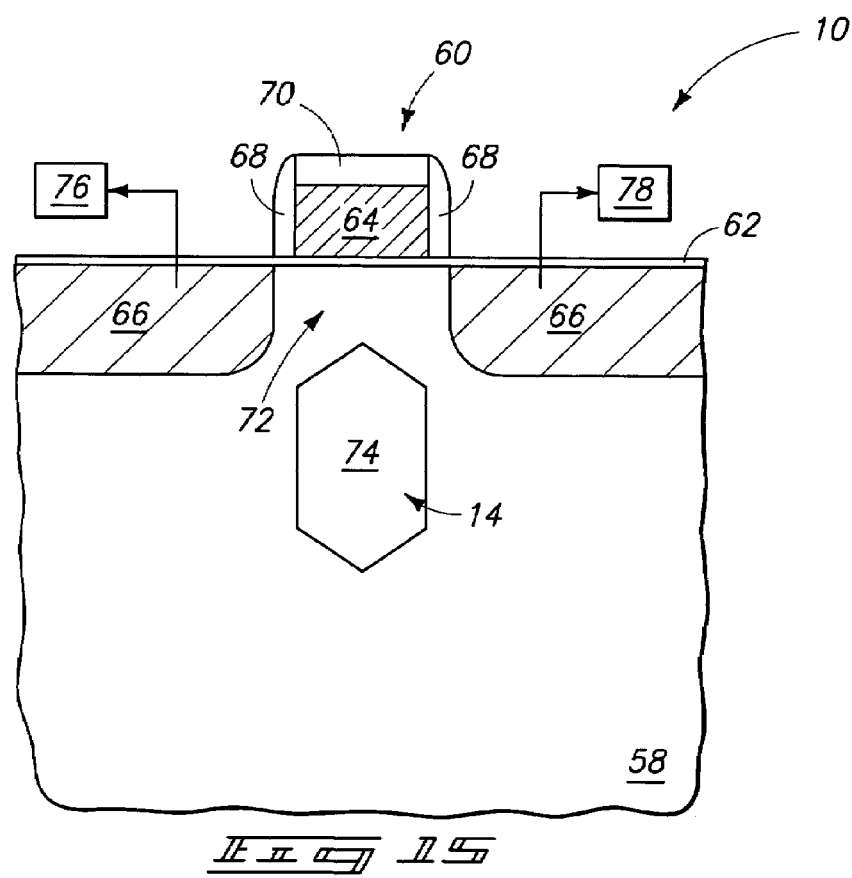
FIG. 15 is a view of the FIG. 14 fragment shown at a processing stage subsequent to that of FIG. 14.

FIG. 15 shows a planar field effect transistor 60 supported by substrate 10. More specifically, FIG. 15 shows a gate dielectric 62 extending across an upper surface of semiconductor material 58, a transistor gate 64 formed over dielectric material 62 and directly over opening 14, and a pair of source/drain regions 66 extending within semiconductor material 58 on opposing sides of gate 64. FIG. 15 also shows a pair sidewall spacers 68 on opposing sides of gate 64, and an electrically insulative cap 70 over gate 64.

Gate dielectric 62 may comprise any suitable composition or combination of compositions; and may, for example, comprise, consist essentially of, or consist of one or both of silicon dioxide and silicon nitride. Electrically insulative sidewall spacers 68, and cap 70, may comprise any suitable compositions or combination of compositions; and may, for example, comprise, consist essentially of, or consist of one or both of silicon dioxide and silicon nitride. Electrically conductive material of gate 64 may comprise any suitable composition or combination of compositions; and may, for example, comprise, consist essentially of, or consist of one or more of metals, metal compositions, and conductively-doped semiconductor material. The source/drain regions may comprise any suitable dopant or combination of dopants, and may be either n-type or p-type doped regions.

A channel region 72 is beneath gate 64 and over opening 14. The gate 64 gatedly interconnects source/drain regions 66 to one another through the channel region.

Opening 14 may be at least partially filled with dielectric material, and is shown filled with a dielectric material 74. Such dielectric material may comprise any suitable composition or combination of compositions, and in some embodiments may comprise, consist essentially of, or consist of one or both of silicon dioxide and silicon nitride.

Source/drain regions 66 are shown electrically connected to circuitry 76 and 78. Such circuitry may correspond to a bitline and a charge storage device if the transistor is incorporated into a DRAM; or the circuitry may correspond to one or more of resistors, ground lines, $V_{CC}$ and transistor gates if transistor 60 is incorporated into an SRAM.

Figure 16:
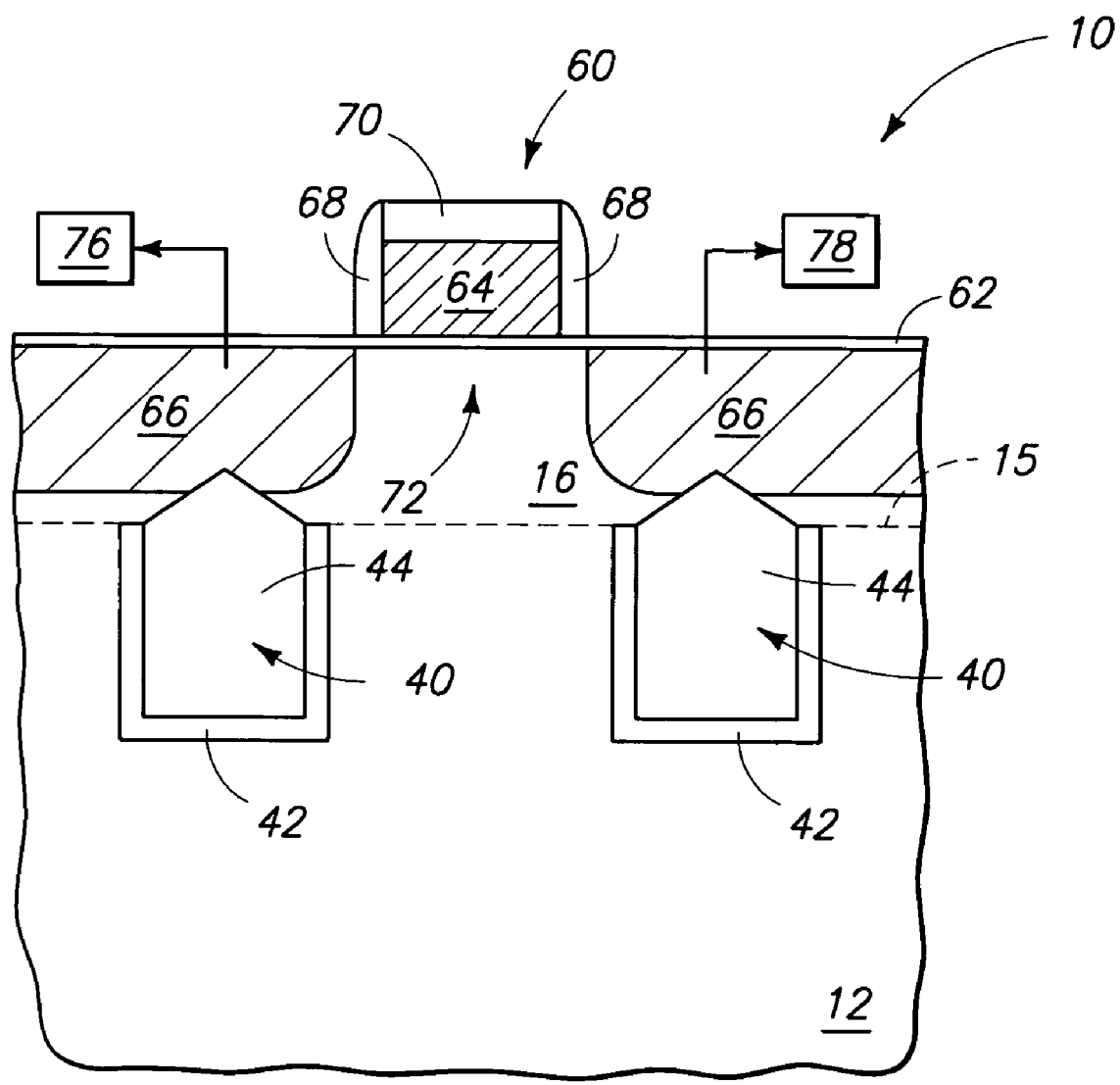
FIG. 16 is a cross-sectional view of a transistor device embodiment.

FIGS. 13 and 15 illustrated embodiments in which openings are provided directly under gates of transistor devices, and are not directly under source/drain regions of the transistor devices. Other embodiments may have the openings directly under the source/drain regions. For instance, FIG. 16 shows substrate 10 supporting a transistor device, and shows openings directly beneath source/drain regions of the transistor device. The openings are not directly beneath a channel region of the device. In referring to FIG. 16, identical numbering will be used as is utilized above in describing FIGS. 13 and 15.

The transistor device of FIG. 16 is a planar device 60 identical to that discussed above with reference to FIG. 15. Thus, the transistor device includes a gate 64 surrounded by insulative materials 68 and 70, and formed over a dielectric material 62. The transistor further includes source/drain regions 66, and a channel region 72 between the source/drain regions.

The openings of FIG. 16 are openings 40 identical to the opening described above with reference to FIG. 13. Thus, the openings have liners 42 partially surrounding their peripheries, and are filled with insulative material 44.

The source/drain regions are connected to the circuitry 76 and 78 discussed above with reference to FIG. 15.

Dielectric material-filled openings 40 may be directly under source/drain regions of DRAM devices to partially isolate the devices from base semiconductor material (with the base semiconductor material being the materials 12 and 16 of FIG. 16). Thus, the transistor device may be incorporated into a partial SOI structure. In the shown embodiment, the source/drain regions extend to the dielectric material-filled openings 40.

Openings 40 of FIGS. 13-17 may be filled with dielectric material (as shown), only partially filled with dielectric material, or left empty (in other words, have gas or vacuum therein). The empty or partially filled openings may have suitable dielectric properties for some applications. If the openings are left empty, the processing will be simpler than processes in which insulative material is formed within the openings. Also, the processing may be simpler than prior art processes of forming partial SOI because various oxide fills, densifications, recesses and planarizations of prior art processes may be omitted. If the openings are left empty, it may be easier to scale processes to less than 50 nanometers. In contrast, it may be difficult to scale prior art partial SOI processes to less than 50 nanometers due to difficulties in scaling processes utilizing uniform oxide fill and densification.

The partial SOI structures of FIGS. 13-17 may be incorporated into $6F^2$ or $8F^2$ DRAM array layouts.

In some embodiments, the openings within a semiconductor material may be at least partially filled with conductive material. An example of such embodiments is shown in FIGS. 17 and 18.

FIG. 17 shows the semiconductor material 58 and opening 14 discussed above with reference to FIG. 14. FIG. 18 shows the opening 14 lined with insulative material 80, and shows the lined opening filled with conductive material 82.

The opening may be lined by exposing a region of the opening, and then either depositing lining material within the opening, or thermally oxidizing the periphery of the opening to form the liner. The liner may comprise any suitable composition or combination of compositions; and may, for example, comprise, consist essentially of, or consist of one or both of silicon dioxide and silicon nitride.

The conductive material 82 may be deposited within the opening through an exposed region of the opening. The conductive material 82 may comprise any suitable composition or combination of compositions; and may, for example, comprise, consist essentially of, or consist of one or more of metals, metal compositions, and conductively-doped semiconductor material.

Although the lining is shown being formed entirely after opening 14 is contained within semiconductor material 58, in other embodiments at least some of the lining may be formed prior to the opening being contained within the semiconductor material. For instance, the opening may be formed with processing analogous to that discussed above with reference to FIGS. 11 and 12. Semiconductor material 58 may then correspond to the combined materials 12 and 16, and some of the opening may be lined prior to formation of the top semiconductor material 16. The unlined portion of the opening under the material 16 (as shown in FIG. 12) may be subsequently lined by deposition and/or thermal oxidation.

The conductive material 82 is shown formed within opening 14 after the opening is entirely contained within semiconductor material 58. It is to be understood, however, that the conductive material may alternatively be formed within the opening at the processing stage of FIG. 11, and then covered by insulative material and an upper semiconductor material to form the construction of FIG. 18.

Figure 19:
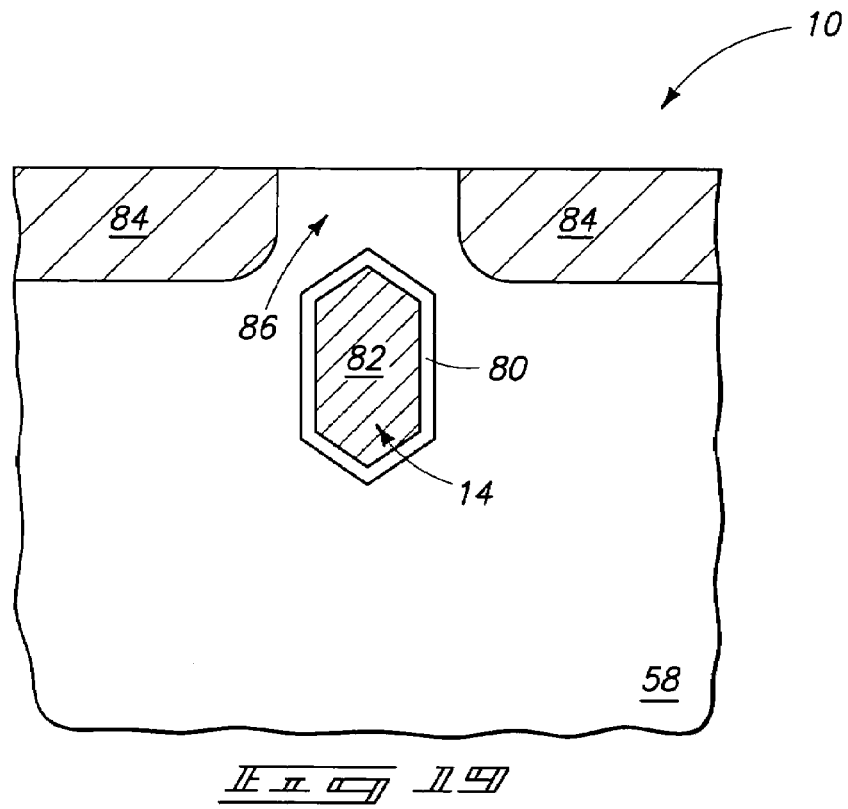

FIG. 19 shows source/drain regions 84 provided within semiconductor material 58 on opposing sides of opening 14, and shows a channel region 86 between the source/drain regions and directly over opening 14. Conductive material 82 within opening 14 may function as a bottom transistor gate. Conductive material 82 may thus gatedly connect source/drain regions 84 to one another through channel 86. In some embodiments, opening 14 may be a conduit extending in and out of the page relative to the across-sectional view of FIG. 19, and conductive material 82 may be a wordline extending along such conduit.

Figure 20:
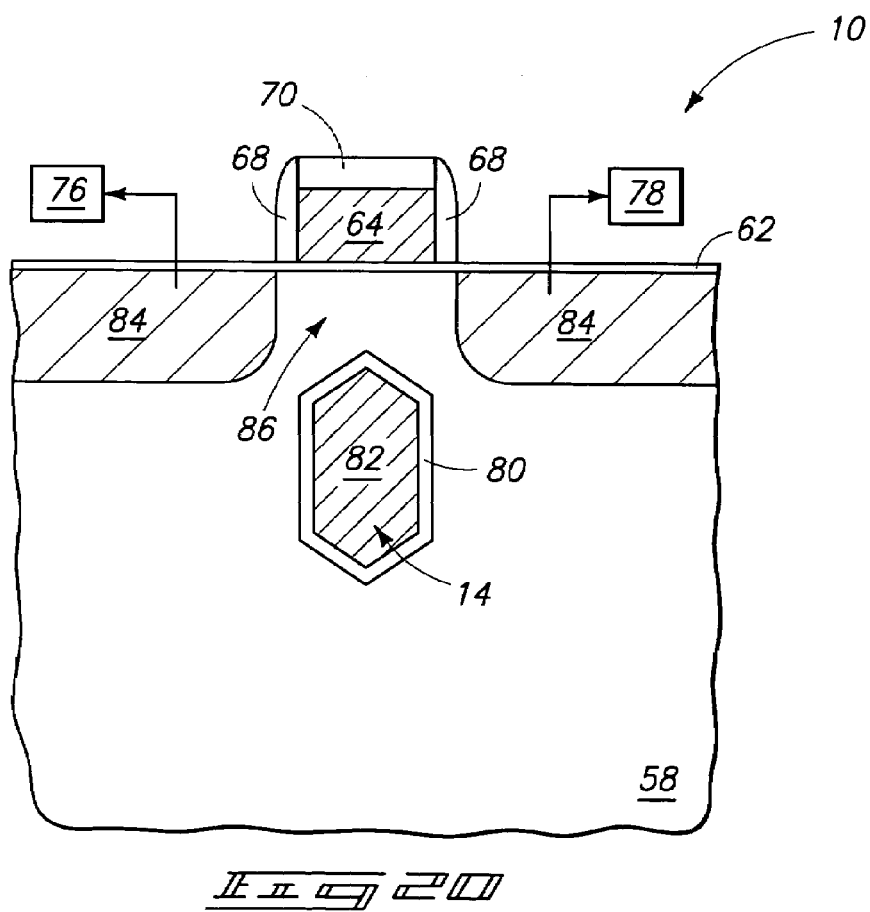

The transistor gate comprising conductive material 82 may be utilized alone, or in combination with a top transistor gate. FIG. 20 shows a top transistor gate 64 formed directly over channel region 86. Gate 64 is separated from semiconductor material 58 by a dielectric material 62. Further, gate 64 is covered by insulative materials 68 and 70. Gate 64, dielectric material 62, insulative material 68, and insulative material 70 may be identical to the materials with the same labels discussed above with reference to FIG. 16.

Source/drain regions 84 are connected to external circuitry 76 and 78, with the external circuitry being identical to that discussed above with reference to FIG. 16. In operation, both of the top gate and the bottom gate may be together utilized to couple source/drain regions 84 through channel region 86.

Another embodiment is to form an electromagnetic radiation interaction component. An electromagnetic radiation interaction component is any component utilized for directing, propagating or altering electromagnetic radiation; and may include, for example, a waveguide for directing radiation having a wavelength in the ultraviolet, visible or infra-red region. The embodiment may include at least partially filling an opening in a semiconductor material with material having different light reflecting properties than the semiconductor material. FIGS. 21 and 22 illustrate an example of such embodiment.

FIGS. 21 and 22 show substrate 10 at a processing stage subsequent to that of FIG. 12. Dielectric material 42 lines portions of the peripheries of openings 40, and liners 90 have been formed along remaining portions of the peripheries of the openings. The lined openings are filled with material 92.

Materials 42 and 90 may comprise the same composition as one another, and in some embodiments, may both comprise, consist essentially of, or consist of one or both of silicon dioxide and silicon nitride. Material 92 may comprise any suitable composition or combination of compositions; and may, for example, comprise metal. For instance, material 92 may comprise cadmium, and in some embodiments may comprise a cadmium-containing composition, such as cadmium oxide. Also, although liners 42 and 90 are present in the shown embodiment, in other embodiments the liners may be omitted so that openings (such as those of FIGS. 5 and 6) are uniformly filled with a single material.

The material 92 may be formed within the openings prior to forming the second semiconductor material across the openings. Alternatively, the second semiconductor material may first be formed across the openings, then regions of the openings may be exposed, and subsequently material 92 may be deposited into the openings through the exposed regions.

In some embodiments, material 92 may be replaced by vacuum or gas; and in some embodiments all of materials 42, 90 and 92 may be replaced by vacuum or gas.

FIG. 22 shows light 94 passing into electromagnetic radiation conduits (or waveguides) comprising material 92 within the openings. The light is directed along a path defined by the electromagnetic radiation conduits. Materials within the openings (for instance, materials 42, 90 and 92 in the shown embodiment) may be chosen to direct particular wavelengths of light. For instance, the electromagnetic radiation conduits may be configured as a high pass frequency filter to be used under epitaxial silicon of CMOS imagers to allow infrared radiation to pass while visible light is reflected back up. Reflection coefficients may be dependent on feature size, as well as on materials utilized in the openings and/or on semiconductor materials utilized to contain the openings.

The electromagnetic radiation interaction component may be tailored for any of numerous applications, including, for example, for utilization with MEMS, CMOS imagers, and other applications in crystalline semiconductors.

FIG. 22 shows the openings as conduits extending linearly through the semiconductor material. The conduits may be formed in any desired shape; including shapes having corners and bends.

Figure 23:
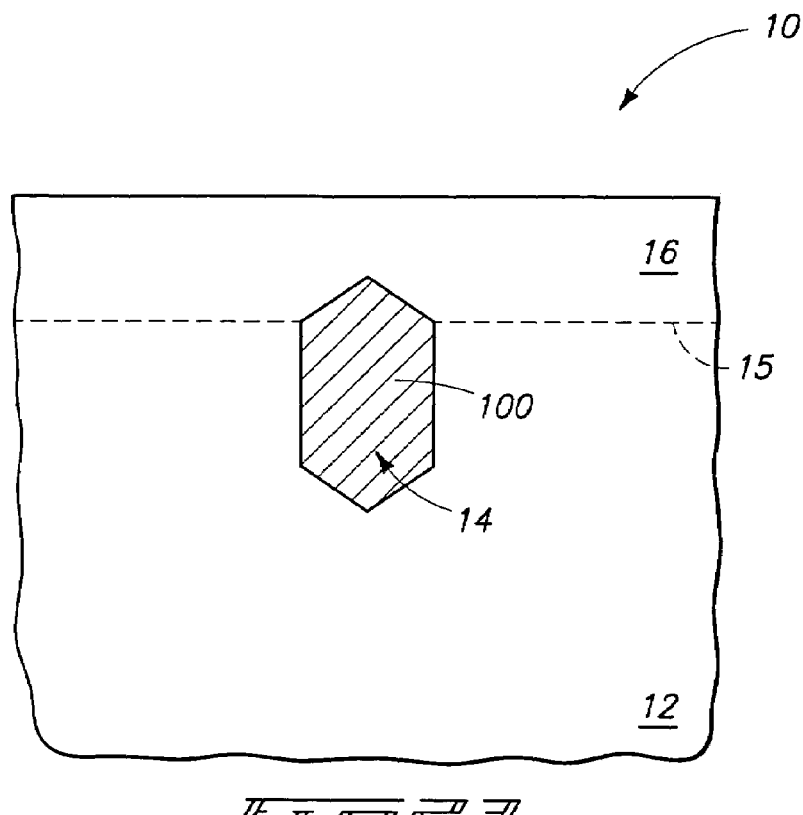
FIG. 23 is a cross-sectional view of a fragment of a monocrystalline semiconductor material at a preliminary processing stage of an embodiment.
Figure 24:
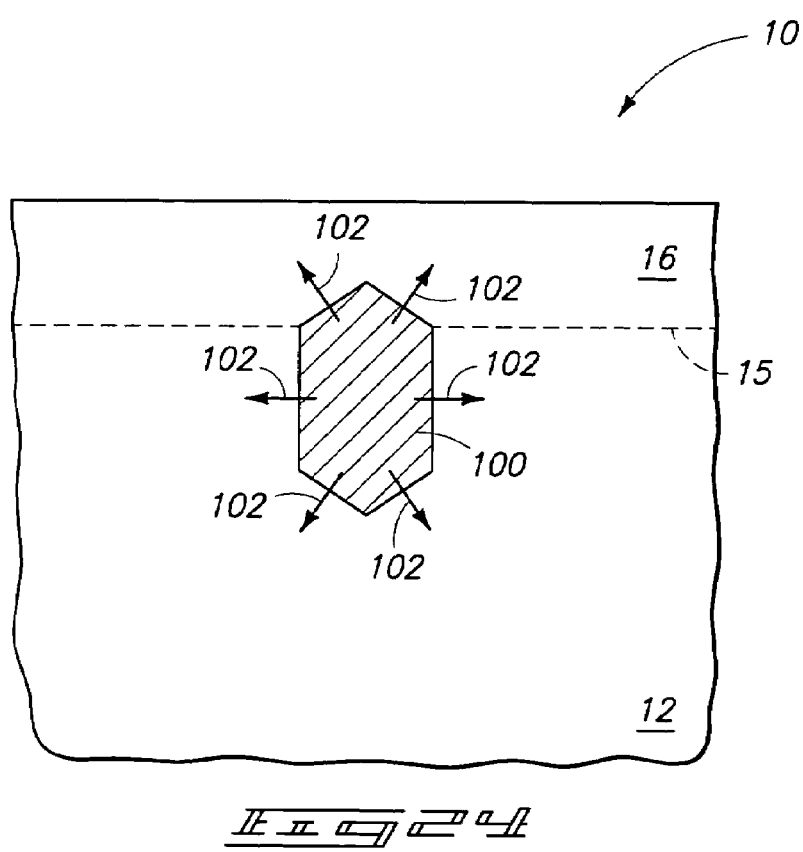
FIGS. 24 and 25 are views of the FIG. 23 fragment shown at processing stages subsequent to that of FIG. 23.
Figure 25:
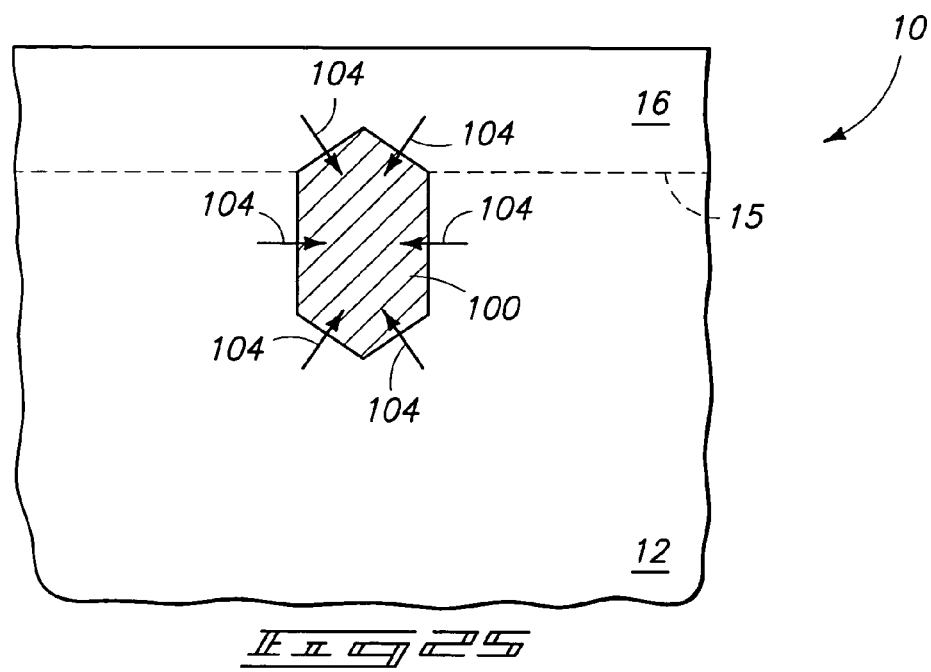

Strain may be imparted to a region of a semiconductor material by providing appropriate material adjacent the region. FIGS. 23-25 illustrate examples of such embodiment.

FIG. 23 shows a portion of substrate 10 at a processing stage subsequent to that of FIG. 6. An opening 14 is contained between semiconductor materials 12 and 16, and is at least partially filled with a material 100. The material 100 comprises a coefficient of thermal expansion different from that of one or both of the semiconductor materials.

Material 100 may comprise any suitable composition or combination of compositions; and may, for example, comprise metal, metal-containing compositions, semiconductor material, or electrically insulative material. Material 100 is illustrated to be electrically conductive in the embodiment of FIG. 23.

Since material 100 comprises a different coefficient of thermal expansion than one or both of semiconductor materials 12 and 16, subjecting substrate 10 to a change in temperature will induce strain in one or both of the semiconductor materials 12 and 16. Such strain results from the different rate of expansion of material 100 relative to the rate of expansion of one or both of materials 12 and 16.

FIG. 24 shows strain induced in semiconductor materials 12 and 16 by raising the temperature when utilizing a material 100 having a greater rate of thermal expansion than the materials 12 and 16. The strain is indicated by arrows 102 pushing outwardly into semiconductor materials 12 and 16. In contrast, FIG. 25 shows strain induced in semiconductor materials 12 and 16 by raising the temperature when utilizing a material 100 having a lower rate of thermal expansion than the materials 12 and 16. The strain is indicated by arrows 104 pushing inwardly toward material 100. The effect illustrated in FIG. 24 may also be achieved by lowering the temperature while utilizing a material 100 having a lower rate of thermal expansion than materials 12 and 16; and the effect illustrated in FIG. 25 may also be achieved by lowering the temperature when utilizing a material 100 having a greater rate of thermal expansion than materials 12 and 16.

The material 100 may be placed in proximity to a semiconductor device to impart strain to a particular region of the device, or to impart strain near a particular region of the device. For instance, material 100 may be utilized in place of the materials 80 and 82 in the embodiment of FIG. 20 to impart strain to the channel region of the transistor device.

Gettering regions may be formed along peripheries of openings in semiconductor materials. Examples of such embodiment are described with reference to FIGS. 26-31.

Figure 26:
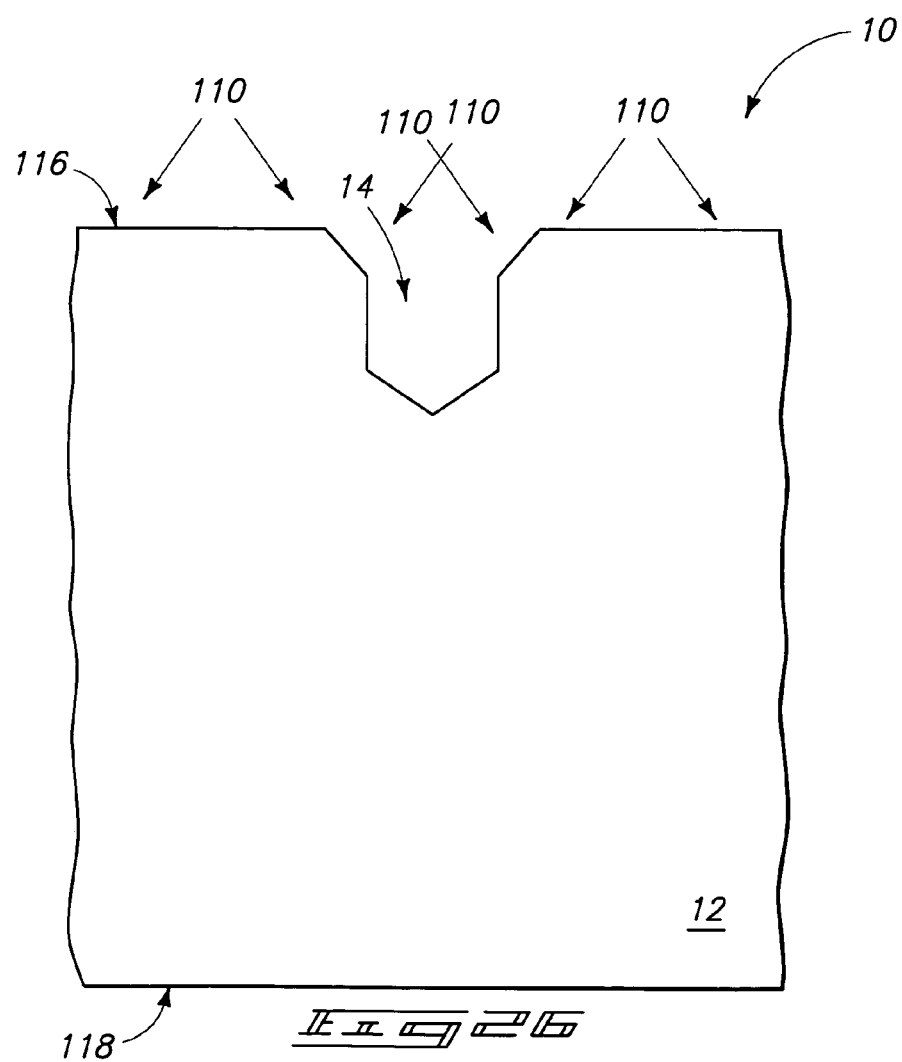
FIG. 26 is a cross-sectional view of a fragment of a monocrystalline semiconductor material at a preliminary processing stage of an embodiment.

FIG. 26 shows a portion of substrate 10 at a processing stage subsequent to that of FIG. 4. The substrate has opening 14 extending into semiconductor material 12. An implant of material 110 is conducted to form a damage region 112 (shown in FIG. 27) along an upper periphery of substrate 12 and within opening 14. The material 110 may be any suitable material to form a damage region, including hydrogen, carbon, silicon, etc.

Substrate 10 has a pair of opposing surfaces 116 and 118, one of which will be a front side surface and the other of which will be a backside surface. If surface 118 is a front side surface, integrated circuitry will ultimately formed across surface 118. If surface 116 is the front side surface, integrated circuitry will ultimately be formed across a surface of a semiconductor material 16 (FIG. 29) epitaxially grown across semiconductor material 12.

Figure 27:
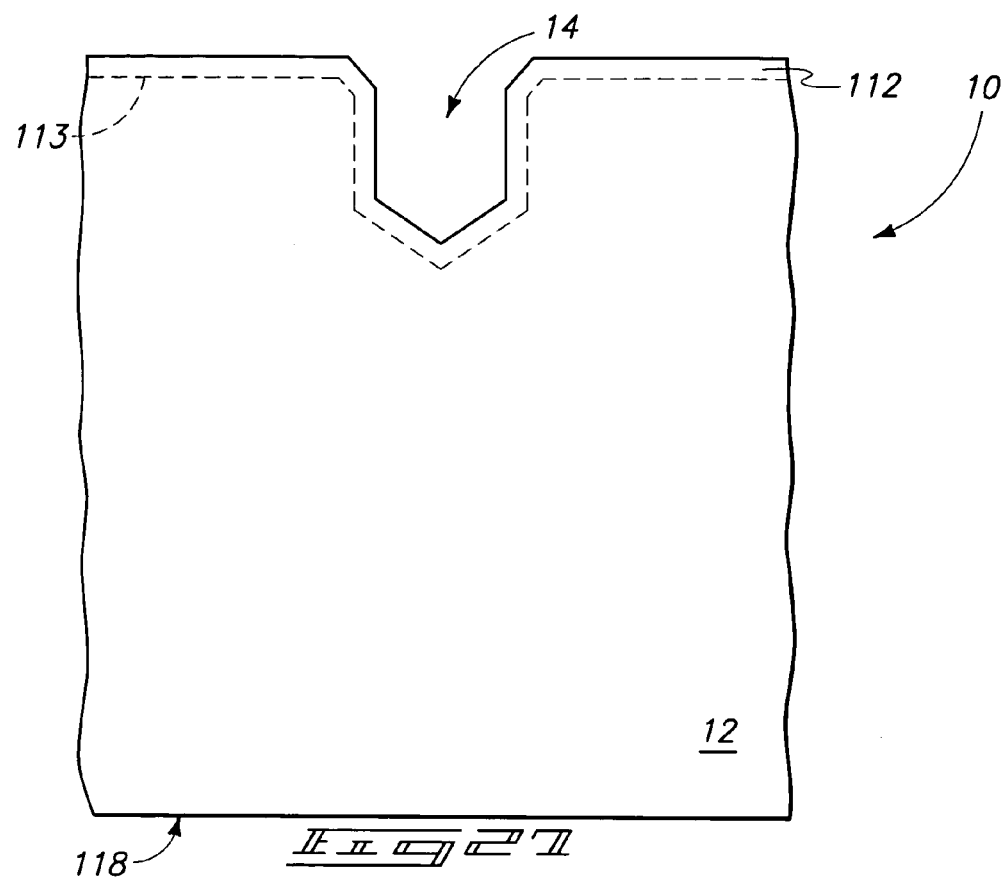

FIG. 27 diagrammatically illustrates damage region 112 as being along a shown upper surface of substrate 12, with an approximate boundary of the damage region being illustrated with dashed line 113. The damage region may comprise lattice defects imparted into a crystalline lattice of a monocrystalline semiconductor material 12.

Figure 28:
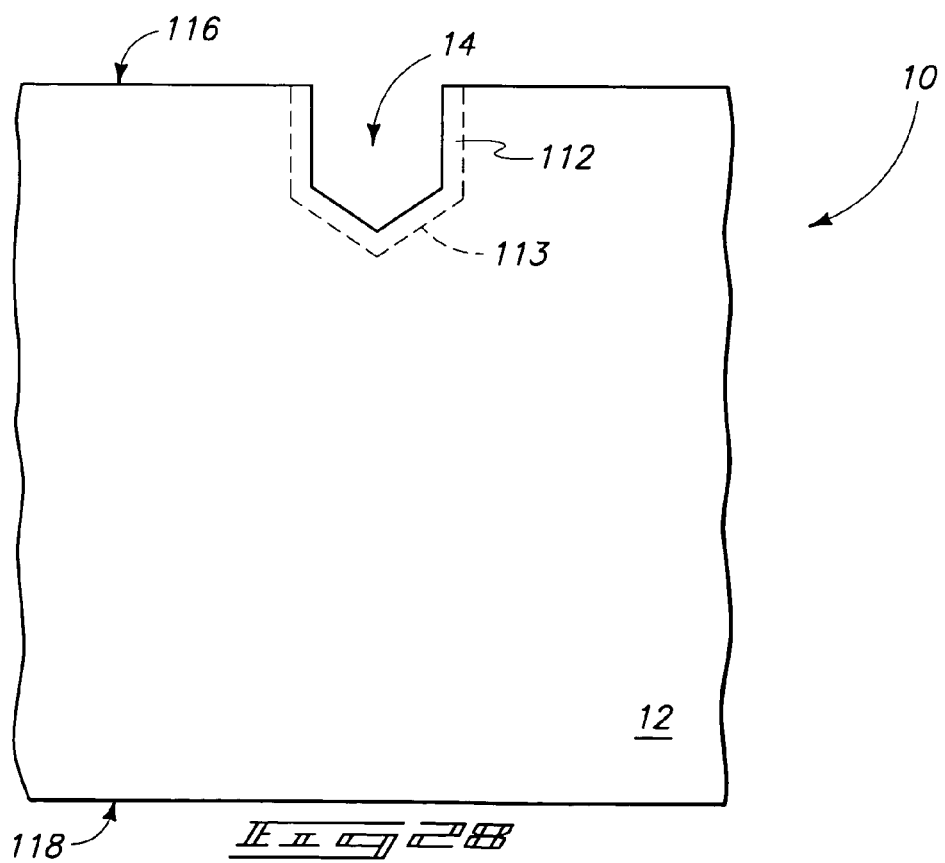

FIG. 28 show substrate 10 after removal of the damage region from over an upper surface of the substrate, while leaving the damage region within opening 14. Such removal may be accomplished with polishing and/or etching of semiconductor material 12.

Figure 29:
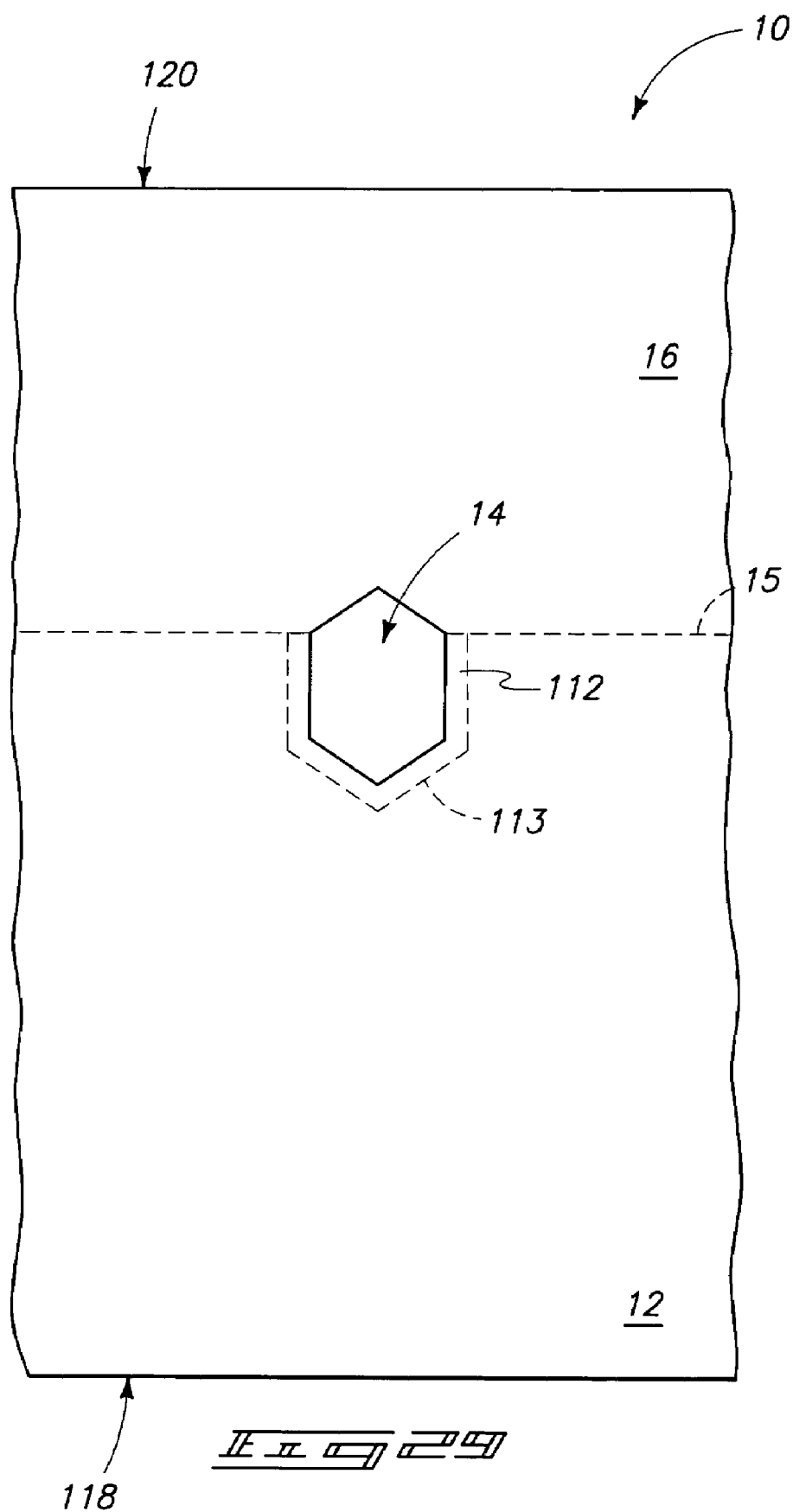

FIG. 29 shows substrate 10 at a processing stage comparable to that of FIG. 7. Specifically, FIG. 29 shows substrate 10 after epitaxial growth of semiconductor material 16 across material 12, and over opening 14. Opening 14 is thus contained within semiconductor materials 12 and 16 at the processing stage of FIG. 29.

Substrate 10 has surface 118 at the processing stage of FIG. 29, and has an opposing surfaces 120 across semiconductor material 16. One of surfaces 118 and 120 is a front side surface, and the other is a backside surface. Damage region 112 may be utilized as a gettering region within substrate 10 to getter problematic substances from within semiconductor materials 12 and 16.

Although all of the lattice defects introduced into the damage region are shown being introduced prior to growth of material 16, at least some of the lattice defects may be introduced after growth of material 16 in some embodiments. Such may be accomplished by, for example, implanting defect-inducing materials through material 16 to a periphery of opening 14.

FIG. 30 shows an embodiment in which surface 118 is a front side surface, and accordingly at least one integrated circuit device 122 is formed across surface 118 (a plurality of circuit devices are shown). The gettering regions 112 are spaced from the integrated circuit devices by about the thickness of semiconductor material 12, which may be from about 2 microns to about 5 microns for an integrated circuit that is not particularly sensitive to dark current or body effects. If the integrated circuit is sensitive to dark current or body effects (for instance, if the integrated circuit includes CMOS imager diodes), the thickness may be form about 10 microns to about 20 microns.

Figure 31:
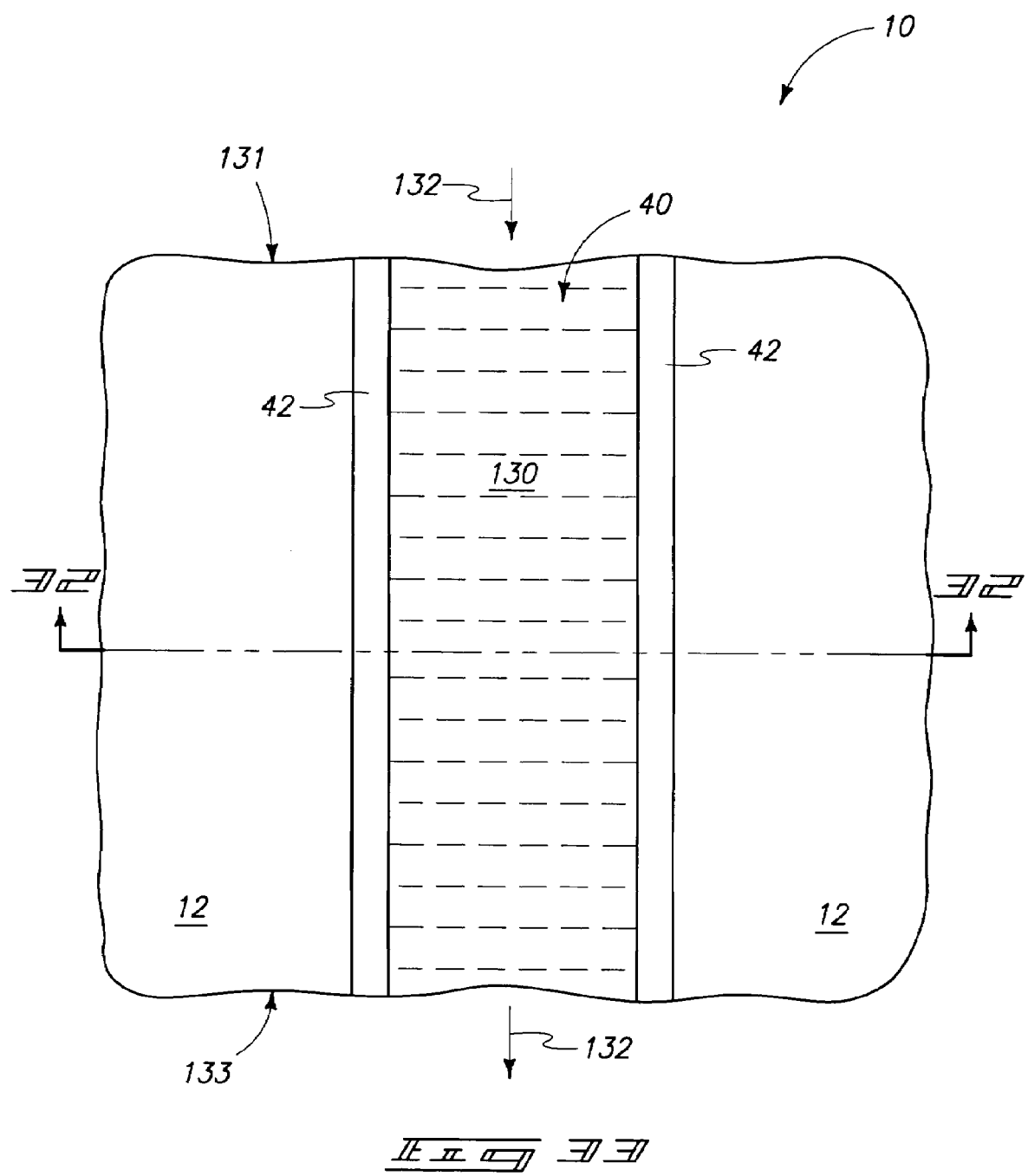

In contrast, FIG. 31 shows an embodiment in which surface 120 is a front side surface, and accordingly at least one integrated circuit device 122 is formed across surface 120. The gettering regions 112 are spaced from the integrated circuit devices by about the thickness of semiconductor material 16, which may be from about 2 microns to about 20 microns. The distance from the circuit devices to the gettering regions may be tailored by adjusting the thickness of material 16.

Cooling regions may be formed from openings in semiconductor materials. Examples of such embodiment are described with reference to FIGS. 32-35.

Figure 32:
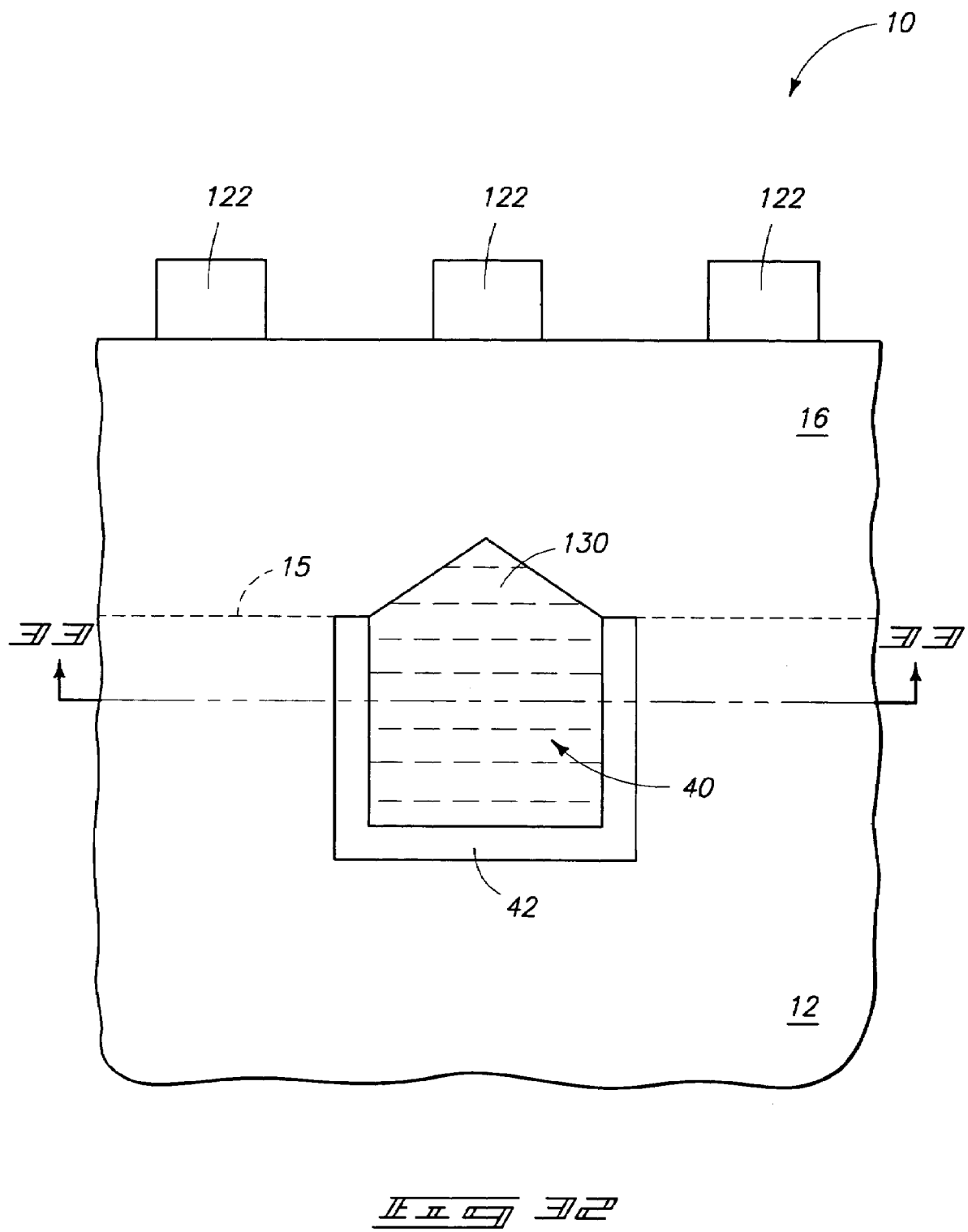

FIGS. 32 and 33 show a substrate 10 similar to the construction discussed above with reference to FIG. 12. The substrate has an opening 40 contained within semiconductor materials 12 and 16. Opening 40 is partially lined with a liner 42 analogous to the structure of FIG. 12, but it is to be understood that the liner may be omitted. Integrated circuitry 122 is shown supported by substrate 10.

FIG. 33 shows substrate 10 to have a first side 131 and a second side 133 in opposing relation to the first side. Opening 40 is shown to be a conduit extending from first side 131 to second side 133. In some embodiments, the substrate 10 may be a semiconductor die, and conduit 40 may extend entirely through the die (or in other words from one side of the die to an opposing side of the die).

Coolant 130 is within opening 40. The coolant is shown to be a fluid. The arrows 132 in FIG. 33 are provided to diagrammatically illustrate that the coolant fluid is flowed through the conduit; but it is to be understood that the coolant fluid may also be static within the conduit in some applications. In embodiments in which the conduit extends from one side of the die to another set of the die, the fluid may be circulated through the conduit to enhance cooling of the die. Although only one conduit is shown, it is to be understood that there may be a plurality of conduits extending through a semiconductor die. Also, although the conduit is shown extending as a straight-line, it is to be understood that the conduit may be formed in any desired shape; including shapes having corners and bends.

Fluid 130 may be gas and/or liquid. In some embodiments, fluid 130 may be a relatively inert gas, such as, for example, nitrogen or argon.

Figure 34:
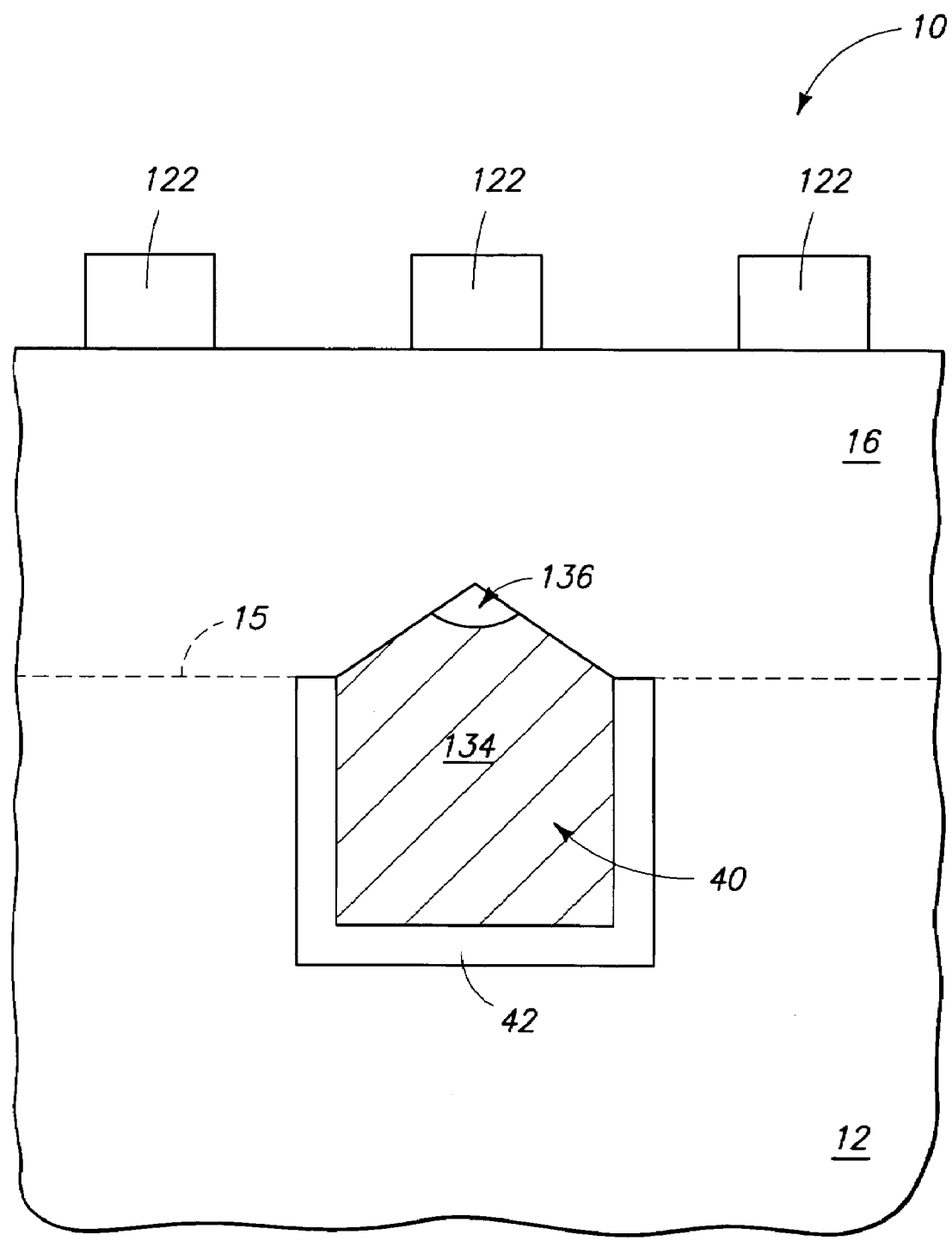
FIG. 34 is a cross-sectional view of a coolant channel embodiment.

FIG. 34 illustrates another embodiment for providing coolant within opening 40, and specifically illustrates a solid material 134 partially filling the opening. Material 134 may comprise any material that is suitably thermally conductive, including, for example, metals and metal-containing compositions. Although material 134 is shown as a solid, it is to be understood that at least some of the material could alternatively be a semi-solid or gel. Material 134 may completely fill opening 40, rather than only partially filling the opening.

In the shown embodiment in which material 134 only partially fills the opening, a gap 136 is within the opening over the material. In some applications, coolant fluid may be flowed through such gap analogously to the flow of coolant fluid discussed above with reference to FIGS. 32 and 33.

Figure 35:
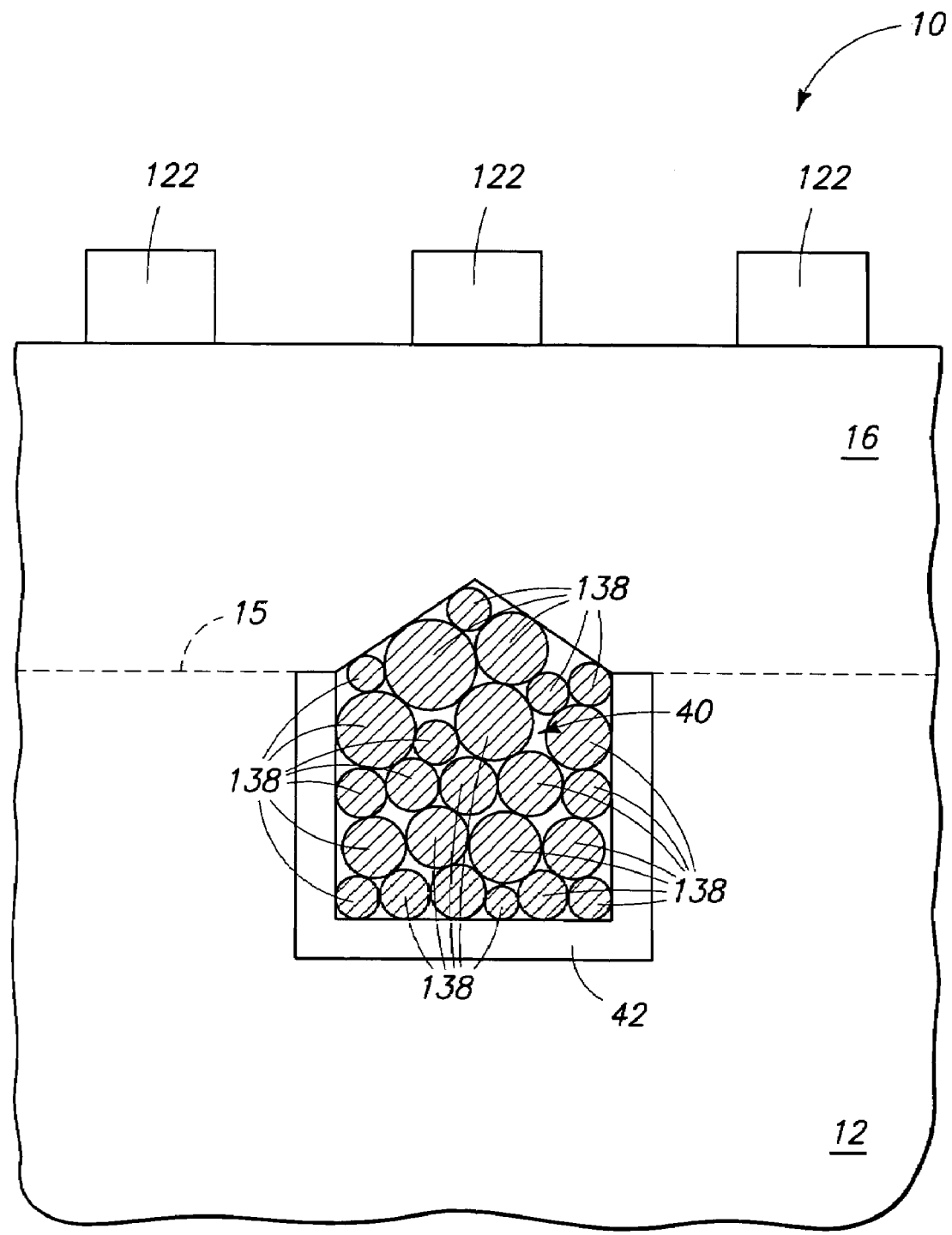
FIG. 35 is a cross-sectional view of a coolant channel embodiment.

FIG. 35 illustrates yet another embodiment for providing coolant within opening 40; and specifically illustrates a plurality of discrete thermally conductive structures 138 within the opening. Structures 138 may comprise any suitable form, including, for example, particles, strands or fibers. The structures may comprise any suitable composition or combination of compositions; including, for example, carbon, metal, or metal-containing compounds. The structures 138 are shown having gaps between them, and in some applications coolant fluid may be flowed through such gaps.

The integrated circuit devices 122 are shown formed across a surface of semiconductor material 16 in FIGS. 32, 34 and 35. It is to be understood, however, that some or all of the integrated circuitry could alternatively be formed on the surface of semiconductor material 12 (the bottom surface in the shown views).

Openings contained within semiconductor materials may be utilized as gas reservoirs. An example of such embodiment is described with reference to FIGS. 36-39.

Figure 36:
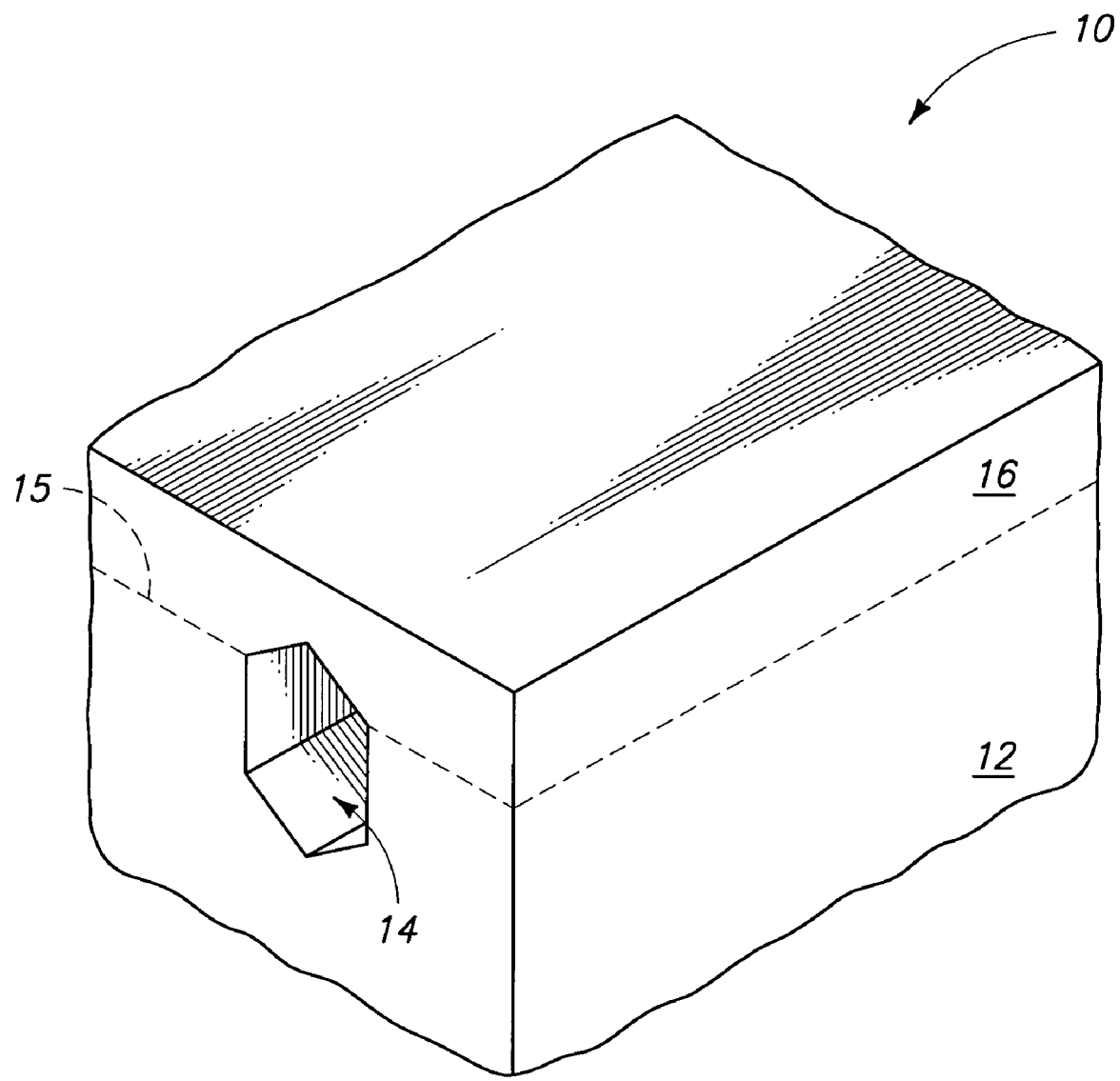
FIG. 36 is a three-dimensional view of a fragment of a monocrystalline semiconductor material at a preliminary processing stage of an embodiment.

FIG. 36 shows a three-dimensional view of substrate 10 at a processing stage subsequent to that of FIG. 5. The substrate has a conduit 14 extending therein, and contained between semiconductor materials 12 and 16. Although the end of the conduit is shown open along the fragment of FIG. 36, it is to be understood that both ends of the conduit may extend to closed terminuses so that the conduit is sealed within semiconductor materials 12 and 16.

Figure 37:
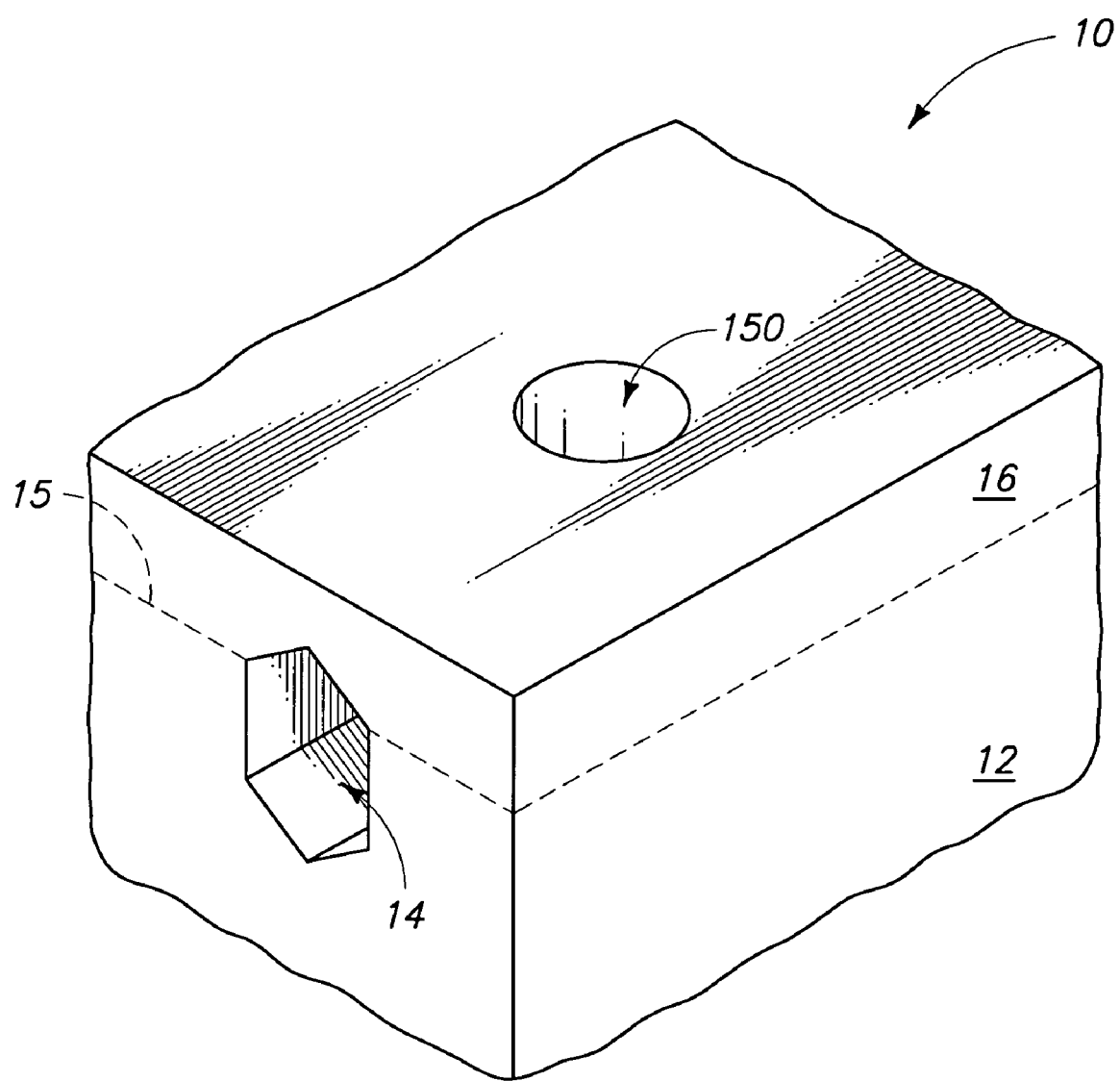
FIGS. 37 and 38 are views of the FIG. 36 fragment shown at processing stages subsequent to that of FIG. 36.

FIG. 37 shows a window 150 formed to extend through semiconductor material 16 to expose part of conduit 14. The window may be formed utilizing a photolithographically patterned mask (not shown) to define the location of the window, followed by an etch through semiconductor material 16 to the conduit, followed by removal of the mask to leave the illustrated structure.

Figure 38:
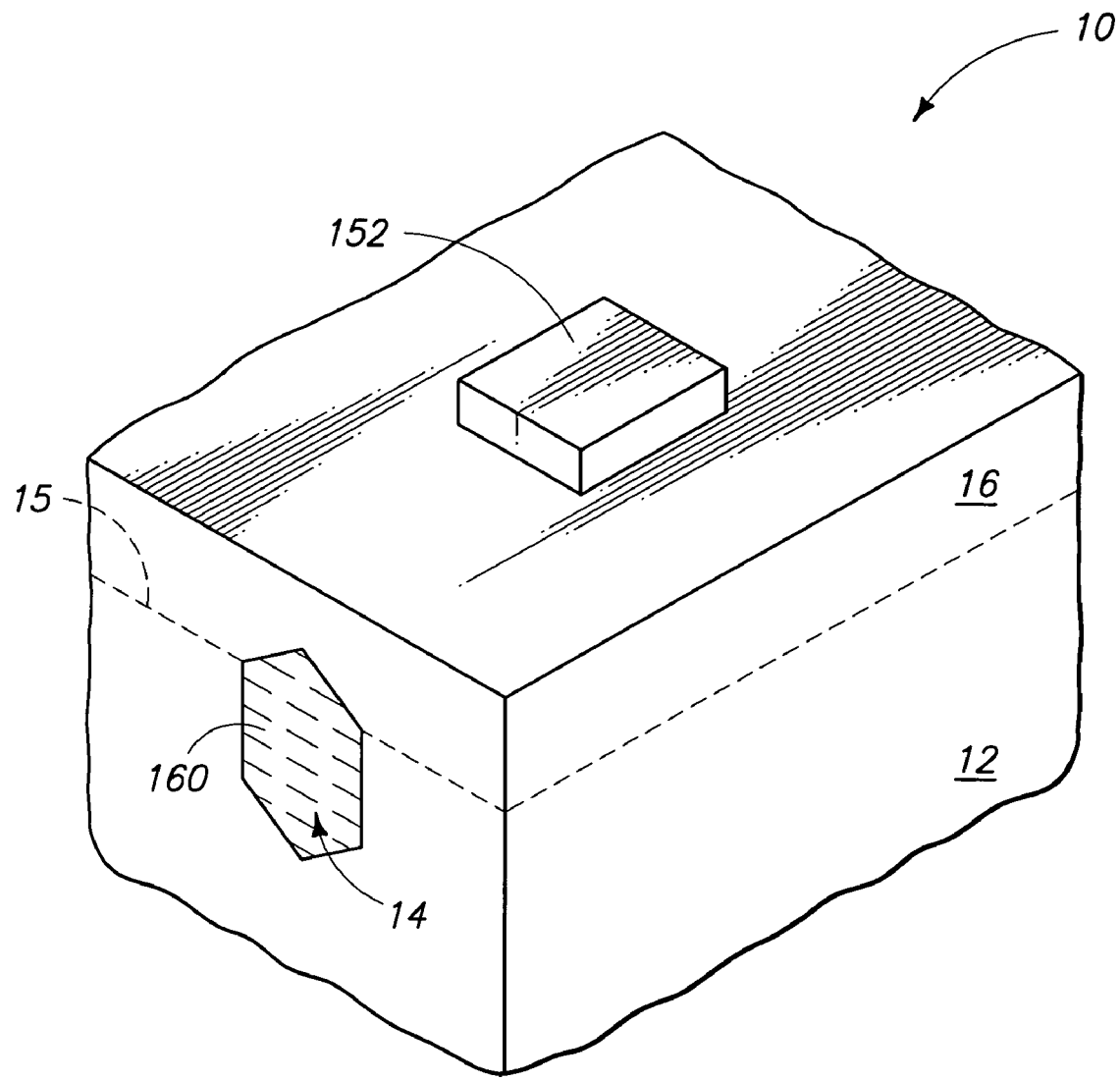

Referring to FIG. 38, gas 160 is provided within opening 14 through window 150 (FIG. 37), and the window is then sealed with a cap (or plug) 152. Cap 152 may comprise any suitable composition or combination of compositions, and may, for example, comprise, consist essentially of, or consist of semiconductor material (such as, for example, polycrystalline silicon). The cap material may be deposited as a layer, and then patterned utilizing a photolithographically patterned resist mask, followed by removal of the mask. Alternatively, the cap material be left as an unpatterned layer across a surface of material 16.

Gas 160 may comprise any suitable composition or combination compositions. In some embodiments, gas 160 may comprise, consist essentially of, or consist of hydrogen (with the term "hydrogen" including any of the hydrogen isotopes unless it is specifically indicated otherwise); and in some embodiments may comprise greater than 99% (by volume) of one or both of the hydrogen isotopes H and D.

Storage of hydrogen within opening 14 essentially utilizes opening 14 as a hydrogen reservoir. The hydrogen sealed within opening 14 may slowly diffuse into semiconductor materials 12 and 16, and thereby provide desired effects relative to integrated circuitry supported by the semiconductor materials. Some of the desired effects which may be provided by hydrogen diffusing into semiconductor materials include passivation of dangling bonds at $Si/SiO_2$ interfaces, and partial passivation of Si interfaces at line and point defects (such defects may occur through semiconductor processing).

Figure 39:
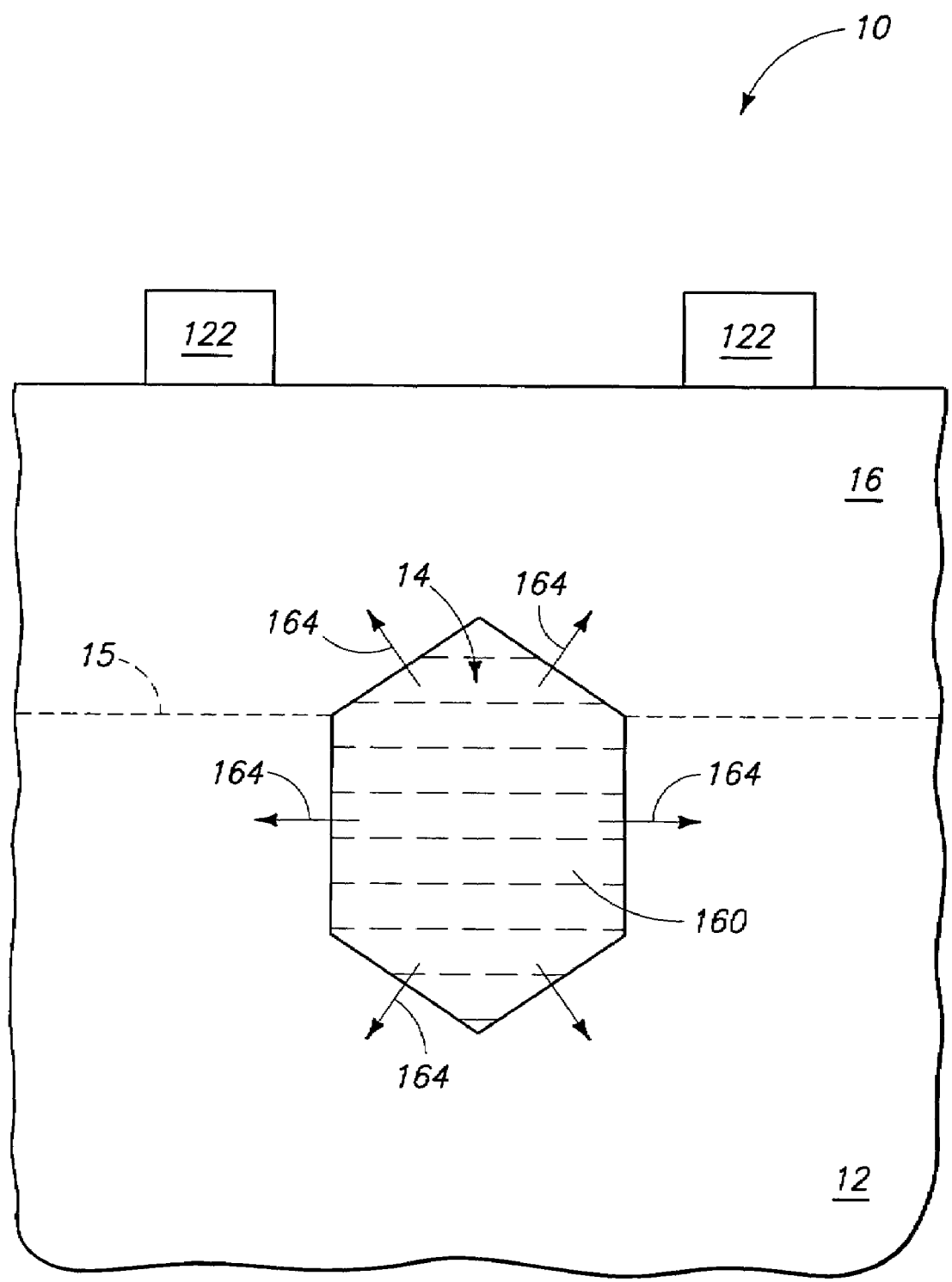
FIG. 39 is a cross-sectional view of a fragment of a monocrystalline semiconductor material showing an embodiment.

FIG. 39 shows substrate 10 with integrated circuitry 122 across a surface of semiconductor material 16. FIG. 39 also shows gas 160 contained within opening 14, and diffusing outwardly from opening 14 into semiconductor materials 12 and 16. The diffusion of the gas into materials 12 and 16 is diagrammatically illustrated by arrows 164. Although the integrated circuitry is shown across a surface of semiconductor material 16, it is to be understood that the integrated circuitry may additionally, or alternatively, be across a surface of semiconductor material 12.

The gas 160 may be considered to be substantially sealed within the opening, in that the gas is retained within the opening for a period of time. The gas would be strictly sealed within the opening if the gas was precluded from migrating out of the opening. The term "substantially sealed" encompasses, but is not limited to, aspects in which gas is strictly sealed. In some applications, gas 160 is sealed in the opening to an extent such that the gas only migrates from the opening by diffusion into one or both of semiconductor materials 12 and 16. A rate of such diffusion may be temperature dependent. If so, the rate may be varied by variation of the temperature of substrate 10.

The processing of FIGS. 36-38 is one example method for providing gas to be substantially sealed within conduit 14. Another example method is to epitaxially grow semiconductor material 16 in an ambient comprising the gas. The gas may then become substantially sealed in the conduit during formation of the bridge of material 16 across the conduit.

In some embodiments, methodology described herein may be considered to correspond to relatively simple procedures for forming crystal silicon (or other semiconductor) bridges or wires at desired locations, which may then be utilized to create transistors having very few, if any, crystal defects. Since problematic materials, like silicon dioxide, may be avoided during epitaxial growth of semiconductor material 16, the material 16 may be CTE (coefficient of thermal expansion) matched to material 12. Thus, the only CTE mismatch in some embodiments is due to materials or vacuum within the openings in the semiconductor material, and not due to interactions between a first semiconductor material and a second epitaxially grown semiconductor material.

In some embodiments, methodology described herein may leave empty openings contained in semiconductor material. Such empty openings may correspond to vacuum gaps. The vacuum gaps may be used for transistors, CMOS imagers, or MEMS devices; and may have desired dielectric constants and/or desired optical constants.

In some embodiments, the ends of gapped areas may be opened to allow the walls and ceiling of a contained opening to be oxidized. If the walls and ceiling comprise monocrystalline silicon, such may create SOI in places where the walls are completely oxidized. Alternately, the walls may be partially oxidized to tailor resistance and body leakage.

In some embodiments, uniaxial compressive stress is built into a structure to overburden silicon, and thus improve mobility for NMOS devices.

In some embodiments, semiconductor materials 12 and 16 may comprise Si, Ge, SiGe, GaAs, SiC, GaAl/N, and/or piezoelectric crystals. Overgrowth may be used for creating waveguides for solid-state lasers, or MEMS built on alternate crystal structures.

In some embodiments, gettering regions may be used to getter oxygen and/or metals, and/or to terminate travel of dislocations. Utilization of a buried level of vacuum slots before standard wafer processing could prevent oxygen, metals, and dislocations from making their way through a wafer. Such may improve packaging of thinner parts, and could be particularly useful in fabrication of semiconductor dies thinned to less than 100 micrometers.

In some embodiments, one or more of the structures described with reference to FIGS. 1-39 can be incorporated into solar cells.

The structures described above with reference to FIGS. 1-39 may be utilized in electronic systems, such as, for example, computer systems.

FIG. 40 illustrates an embodiment of a computer system 400. Computer system 400 includes a monitor 401 or other communication output device, a keyboard 402 or other communication input device, and a motherboard 404. Motherboard 404 may carry a microprocessor 406 or other data processing unit, and at least one memory device 408. Memory device 408 may comprise an array of memory cells, and such array may be coupled with addressing circuitry for accessing individual memory cells in the array. Further, the memory cell array may be coupled to a read circuit for reading data from the memory cells. The addressing and read circuitry may be utilized for conveying information between memory device 408 and processor 406. Such is illustrated in the block diagram of the motherboard 404 shown in FIG. 41. In such block diagram, the addressing circuitry is illustrated as 410 and the read circuitry is illustrated as 412.

Either or both of processor device 406 and memory device 408 may utilize one or more of the embodiments described with reference to FIGS. 1-39.

Figure 42:
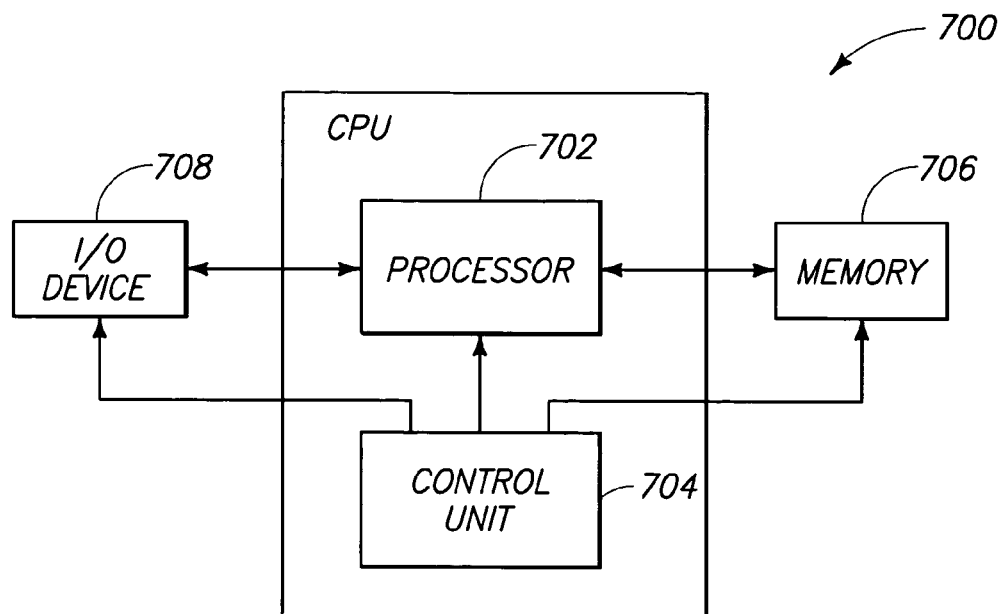
FIG. 42 is a high level block diagram of an electronic system embodiment.

FIG. 42 illustrates a simplified block diagram of a high-level organization of an electronic system 700. System 700 may correspond to, for example, a computer system, a process control system, or any other system that employs a processor and associated memory. Electronic system 700 has functional elements, including a processor 702, a control unit 704, a memory device unit 706 and an input/output (I/O) device 708 (it is to be understood that the system may have a plurality of processors, control units, memory device units and/or I/O devices in various embodiments). Generally, electronic system 700 will have a native set of instructions that specify operations to be performed on data by the processor 702 and other interactions between the processor 702, the memory device unit 706 and the I/O device 708. The control unit 704 coordinates all operations of the processor 702, the memory device 706 and the I/O device 708 by continuously cycling through a set of operations that cause instructions to be fetched from the memory device 706 and executed. One or more of the components of system 700 may utilize one or more of the embodiments described with reference to FIGS. 1-39.

Figure 43:
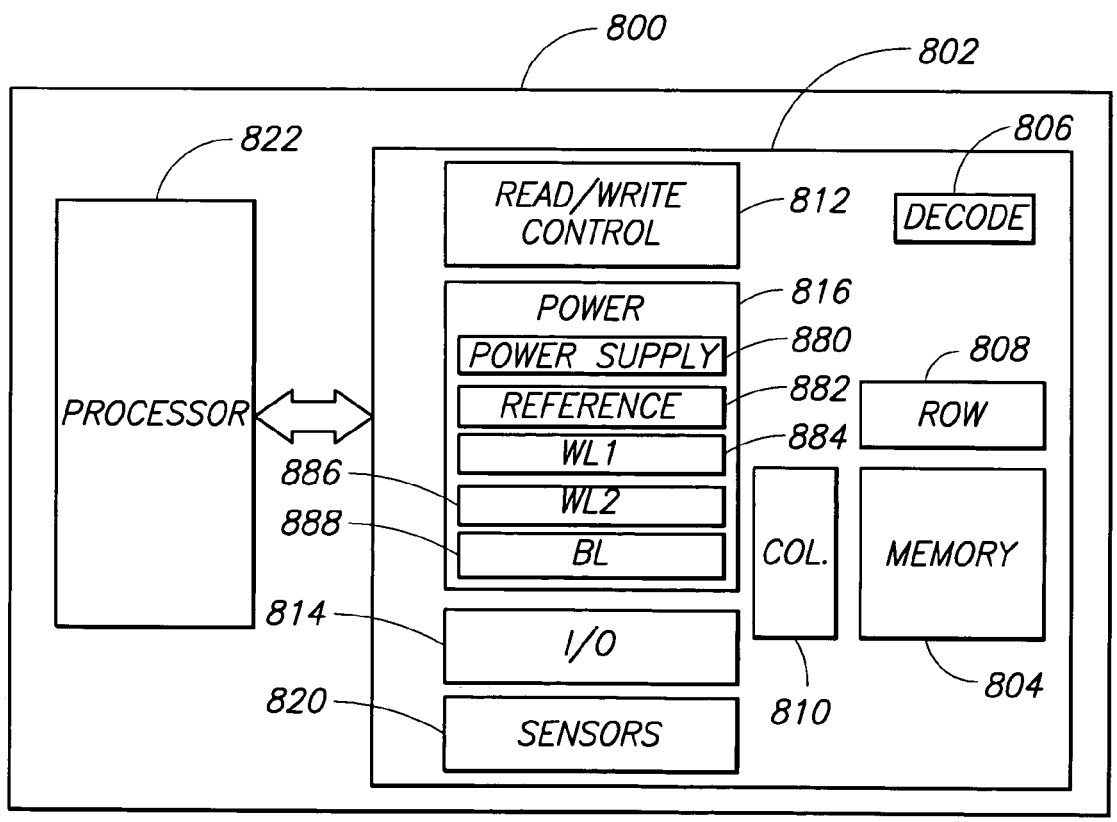
FIG. 43 is a simplified block diagram of a memory device embodiment.

FIG. 43 is a simplified block diagram of an electronic system 800. The system 800 includes a memory device 802 that has an array of memory cells 804, address decoder 806, row access circuitry 808, column access circuitry 810, read/write control circuitry 812 for controlling operations, and input/output circuitry 814. The memory device 802 further includes power circuitry 816, and sensors 820, such as current sensors for determining whether a memory cell is in a low-threshold conducting state or in a high-threshold non-conducting state. The illustrated power circuitry 816 includes power supply circuitry 880, circuitry 882 for providing a reference voltage, circuitry 884 for providing a first wordline with pulses, circuitry 886 for providing a second wordline with pulses, and circuitry 888 for providing a bitline with pulses. The system 800 also includes a processor 822, or memory controller for memory accessing.

The memory device 802 receives control signals from the processor 822 over wiring or metallization lines. The memory device 802 is used to store data which is accessed via I/O lines. At least one of the processor 822 or memory device 802 may utilize one or more of the embodiments described with reference to FIGS. 1-39.

The various electronic systems may be fabricated in single-package processing units, or even on a single semiconductor chip, in order to reduce the communication time between the processor and the memory device(s).

The electronic systems may be used in memory modules, device drivers, power modules, communication modems, processor modules, and application-specific modules, and may include multilayer, multichip modules.

The electronic systems may be any of a broad range of systems, such as clocks, televisions, cell phones, personal computers, automobiles, industrial control systems, aircraft, etc.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. A method of forming a transistor device, comprising:
   forming one or more openings extending into a first semiconductor material;
   depositing dielectric material within the one or more openings to fill the one or more openings with the dielectric material;
   epitaxially growing a second semiconductor material across the first semiconductor material, the second semiconductor material bridging across the one or more openings;
   forming a transistor gate over the second semiconductor material;
   forming a pair of conductively-doped source/drain regions within the second semiconductor material and proximate the transistor gate; the source/drain regions being spaced from one another by a channel region within the second semiconductor material directly beneath the transistor gate;
   wherein the one or more filled openings are directly beneath at least one of the channel region and the source/drain regions.

2. The method of claim 1 wherein the first semiconductor material comprises monocrystalline silicon, and wherein the epitaxially growing the second semiconductor material comprises epitaxially growing monocrystalline silicon from the monocrystalline silicon of the first semiconductor material.

3. The method of claim 1 wherein the depositing of the dielectric material occurs prior to the epitaxially growing of the second semiconductor material.

4. The method of claim 1 wherein the depositing of the dielectric material occurs after the epitaxially growing of the second semiconductor material.

5. The method of claim 1 wherein the first semiconductor material comprises monocrystalline silicon, and wherein the epitaxially growing the second semiconductor material comprises epitaxially growing one or more of Ge, Ga, Ga/Al, Si/Ge, and Ga/As over the first semiconductor material.

6. The method of claim 1 wherein the filling the one or more openings with the dielectric material comprises filling the one or more openings with one or both of silicon dioxide and silicon nitride.

7. The method of claim 1 wherein the one or more filled openings is a single filled opening directly beneath the channel region and not directly beneath either of the source/drain regions.

8. The method of claim 1 wherein the one or more filled openings are a pair of filled openings directly beneath the source/drain regions and not directly beneath the channel region.

9. The method of claim 8 wherein the forming the conductively-doped source/drain regions comprises forming the source/drain regions to extend through the second semiconductor material to the filled openings.

10. A method of forming a transistor device, comprising:
   forming an opening extending into a first semiconductor material;
   epitaxially growing a second semiconductor material across the first semiconductor material to bridge across the opening and form a trough over the opening;
   forming a transistor gate extending into the trough, the entirety of the transistor gate being contained within the trough; and
   forming a pair of conductively-doped source/drain regions within the second semiconductor material and proximate the transistor gate; the source/drain regions being spaced from one another by a channel region within the second semiconductor material between the transistor gate and the opening.

11. The method of claim 10 further comprising depositing dielectric material within the opening prior to epitaxially growing the second semiconductor material.

12. The method of claim 10 further comprising depositing dielectric material within the opening after epitaxially growing the second semiconductor material.

13. The method of claim 10 further comprising:
   forming an insulative material liner along sidewalls of the opening prior to epitaxially growing the second semiconductor material; and
   depositing dielectric material along the liner within the opening after epitaxially growing the second semiconductor material.

14. The method of claim 10 further comprising:
   forming an insulative material liner along sidewalls of the opening prior to epitaxially growing the second semiconductor material; and
   depositing dielectric material along the liner within the opening prior to epitaxially growing the second semiconductor material.

* * * * *